US012014732B2

(12) United States Patent
Elkhatib et al.

(10) Patent No.: US 12,014,732 B2
(45) Date of Patent: Jun. 18, 2024

(54) ENERGY EFFICIENT CUSTOM DEEP LEARNING CIRCUITS FOR ALWAYS-ON EMBEDDED APPLICATIONS

(71) Applicant: AONDEVICES, INC., Irvine, CA (US)

(72) Inventors: Mouna Elkhatib, Irvine, CA (US); Adil Benyassine, Irvine, CA (US)

(73) Assignee: AONDEVICES, INC., Irvine, CA (US)

( * ) Notice: Subject to any disclaimer, the term of this patent is extended or adjusted under 35 U.S.C. 154(b) by 401 days.

(21) Appl. No.: 17/275,484

(22) PCT Filed: Sep. 13, 2019

(86) PCT No.: PCT/US2019/051117
§ 371 (c)(1),
(2) Date: Mar. 11, 2021

(87) PCT Pub. No.: WO2020/056329
PCT Pub. Date: Mar. 19, 2020

(65) Prior Publication Data
US 2022/0122592 A1    Apr. 21, 2022

Related U.S. Application Data

(60) Provisional application No. 62/772,476, filed on Nov. 28, 2018, provisional application No. 62/731,670, (Continued)

(51) Int. Cl.
*G10L 15/22* (2006.01)
*G06N 3/02* (2006.01)
*G06N 3/063* (2023.01)
*G10L 15/08* (2006.01)
*G10L 15/16* (2006.01)
(Continued)

(52) U.S. Cl.
CPC ............ *G10L 15/22* (2013.01); *G06N 3/02* (2013.01); *G06N 3/063* (2013.01); *G10L 15/08* (2013.01); *G10L 15/16* (2013.01); *G10L 15/30* (2013.01); *G10L 25/30* (2013.01); *G10L 25/78* (2013.01);
(Continued)

(58) Field of Classification Search
CPC .......... G10L 15/22; G10L 15/16; G10L 15/30
See application file for complete search history.

(56) References Cited

U.S. PATENT DOCUMENTS 6,044,343 A   3/2000  Cong et al.
9,076,441 B2  7/2015  Larri et al.
(Continued)

OTHER PUBLICATIONS

International Search Report & Written Opinion for PCT/US2019/051117; dated Jan. 14, 2020.

*Primary Examiner* — Ibrahim Siddo
(74) *Attorney, Agent, or Firm* — Stetina Brunda Garred & Brucker

(57) ABSTRACT

A system can include a circuit holistically customized for the detection of commands in an audio or video input signal to meet certain application-specific requirements. The circuit can have a neural network topology that is hardwired to perform detection based on application-specific detection criteria. The hardwired custom circuit can provide improved energy efficiencies compared to similar functionality carried out using software and generic hardware modules. The system can also include a sound change trigger module and perform non-voiced sound detection.

22 Claims, 22 Drawing Sheets

Related U.S. Application Data filed on Sep. 14, 2018, provisional application No. 62/731,681, filed on Sep. 14, 2018, provisional application No. 62/731,657, filed on Sep. 14, 2018, provisional application No. 62/731,666, filed on Sep. 14, 2018.

(51) Int. Cl.
*G10L 15/30* (2013.01)
*G10L 25/30* (2013.01)
*G10L 25/78* (2013.01)
*H03M 1/12* (2006.01)

(52) U.S. Cl.
CPC ......... *H03M 1/12* (2013.01); *G10L 2015/088* (2013.01); *G10L 2015/223* (2013.01)

(56) References Cited

U.S. PATENT DOCUMENTS

| | | | |
|---|---|---|---|
| 2018/0121796 A1* | 5/2018 | Deisher | G10L 15/16 |
| 2020/0042877 A1* | 2/2020 | Whatmough | G06F 1/3243 |

* cited by examiner

Noise Profile Change - an example of a change in background sound profile where the background sound, and specifically the background noise level changed from 25dB SNR to 10dB SNR Voice Recognition with embedded background sound profile change trigger

ENERGY EFFICIENT CUSTOM DEEP LEARNING CIRCUITS FOR ALWAYS-ON EMBEDDED APPLICATIONS

CROSS-REFERENCE TO RELATED APPLICATIONS

This application is a national stage application, filed under 35 U.S.C. § 371, of International Patent Application No. PCT/US/2019/051117, filed on Sep. 13, 2019 which claims priority under 35 U.S.C. § 119(e) to U.S. Provisional Patent Application number 62/772,476 filed on Nov. 28, 2018, U.S. Provisional Patent Application No. 62/731,681 filed on Sep. 14, 2018, U.S. Provisional Patent Application No. 62/731,657 filed on Sep. 14, 2018, U.S. Provisional Patent Application No. 62/731,666 filed on Sep. 14, 2018, and U.S. Provisional Patent Application No. 62/731,670 filed on Sep. 14, 2018, the entire contents of which are incorporated herein by reference in their entirety.

BACKGROUND

The present application relates to a deep learning system incorporated in energy efficient applications such as always-on embedded applications. The system may be monitoring data from a microphone, camera, biological sensor, physiological sensor, or any other type of sensor or signals from any source.

Traditional computing devices are controlled by physically interacting with the device, such as by pressing one or more buttons on the device. For example, a laptop computer is often controlled by a keyboard, where the user interacts with the keyboard to affect change on the laptop. A user may interact with the keyboard of the laptop to play music by a first artist. After some time has passed, the user may interact with the keyboard of the laptop to change the music that is playing to a second artist. In this manner, the laptop is considered always on because it is ready to accept input commands from the user at any time.

A speaker based computing device may play music to a listener. An example of such a speaker based computing device is the Echo available from Amazon and the HomePod available from Apple. While listening to the music, the listener may desire to switch to different music. The listener may alert the computing device of the desire for a change, such as by speaking out loud "Hey Speaker", during the playing of the music. At this point in time the speaker may silence the playing of the music and listen for further voice commands from the listener. For example, the listener may say "Play Sezen Aksu". After receiving the command from the listener, the speaker alone or in combination with an Internet based service, interprets the command. The interpretation of the command may include downloading random music by Sezen Aksu, and then playing music by Sezen Aksu on the speaker for the listener.

SUMMARY

An example system can include non-transitory computer-readable medium comprising a plurality of command instructions stored thereon and a neural network detector with a deep learning neural network hardware topology. The neural network detector can be hardwired to receive an audio signal and/or a video signal and hardwired to select a command instruction from the instructions stored in memory based on the audio and/or video.

The system can include one or more electrical inputs for receiving the audio signal and/or the video signal and providing the audio signal and/or video signal to the neural network detector. The system can include an application processor interface connected to the neural network detector. The application processor interface can transmit the selected command instruction(s) in a format that is executable by an application processor.

The electrical input, neural network, and application processor interface can be integrated as a single device. The single device can be a standalone chip, a codec chip, a microphone, a speaker, an image capture device, or an application processor. For instance, the single device can be a semiconductor chip.

The neural network topology can include a convolution neural network, a recurrent neural network, other type of suitable network as would be appreciated and understood by a person of ordinary skill in the art, or a combination of the aforementioned networks.

The audio signal can be an audio stream. The video signal can be a video stream.

The system can include an event detection circuit configured to receive the audio stream and/or video stream, detect an event in the audio stream and/or video stream, and transmit the audio signal and/or video signal to the neural network. The transmitted audio and/or video signal can be a portion (time window) of the audio/video stream including and/or immediately following the detected event. The event detection circuit can include a voice activity detection (VAD) module. The VAD module can receive the audio stream and detect a presence of a voice in the audio stream.

The event detection circuit can include a sound profile change trigger module to detect a change in a non-voiced sound in the audio stream.

When the event detection circuit has a module that detects a presence of a voice (e.g. VAD) and a sound profile change trigger module, the event detection circuit can include a status logic module that provides an output state to indicate whether a voice is detected, sound change is detected, both are detected, and/or neither are detected.

When the event detection circuit is sound based and provides an audio signal, the neural network detector can be hardwired to receive the audio signal from the event detection circuit and select a command instruction from the instructions in memory based on the content of the audio signal.

The system can include a microphone interface. The system can include a digital signal processing block connected to the microphone interface and the neural network detector. The system can include a multiplexer connected to the digital signal processing block and the neural network detector. The multiplexer can also be connected to an external input connection and can be configured to select and provide the microphone input and the external input to the neural network detector.

The neural network hardware topology can include a hardwired deep learning data path. The neural network hardware topology can include programmable weights, fixed weights, or a combination of programmable and fixed weights.

Another example system can include an event detection circuit, a first stage command phrase detection circuit, an application processor interface, and a second stage application processor. The event detection circuit can receive a streaming audio signal and detect the presence of a voice in the streaming audio signal. The first stage command phrase detection circuit can receive a portion of the streaming audio signal once the voice is detected by the event detection circuit. The first stage command phrase detection circuit can extract speech features from the portion of the streaming audio. The first stage command phrase detection circuit can have a neural network topology. The application processor interface can be connected to the first stage command phrase detection circuit and the second stage application processor. The application processor interface can receive the extracted speech features from the first stage command phrase detection circuit and transmit the extracted speech features to the second stage application processor. The application processor interface can also provide an interrupt signal to the second stage application processor in response to receiving the extracted speech features. The second stage application processor can receive the extracted speech features from the application processor interface and select a command phrase based on the speech features. The second stage application processor can receive the interrupt signal and transition from a standby mode to an active mode in response to receiving the interrupt signal. The second stage application processor can thereby operate predominantly in standby mode. The selected command phrase can be one of a list of predetermined command phrases. The selected command phrase can be the predetermined command phrase in the list that most matches the extracted speech features.

The event detection circuit, first stage command phrase detection circuit, and application processor interface can be integrated as a single device. The single device can be a standalone chip, a codec chip, a microphone, a speaker, an image capture device, or an application processor. For instance, the single device can be a semiconductor chip.

The event detection circuit and the first stage command phrase detection circuit can be integrated in a neural network configuration for deep learning.

In another example, a SoC can include a digital microphone interface, a digital signal processing circuit block, a voice activity detection block, and a weights storage and artificial intelligence engine block. The digital microphone interface can receive a digitized audio stream. The digital processing block can filter the digitized audio stream. The voice activity detection block can detect voice activity in the filtered, digitized audio stream and activate the weights storage and artificial intelligence engine block as a result of detecting voice activity. The weights storage and artificial intelligence engine block can include a memory store and a neural network topology. The memory store can have weights stored thereon. The neural network topology, by making use of the weights, can extract command phrases from a filtered, digitized audio signal that is a portion of the filtered, digitized audio stream.

In another example, a SoC can include a digital microphone interface, a digital signal processing circuit block, and a weights storage and artificial intelligence engine block. The digital microphone interface can receive a digitized audio stream. The digital signal processing circuit block can filter the digitized audio stream. The weights storage and artificial intelligence engine block can include a memory store and a neural network topology. The memory store can store weights thereon. The neural network topology, by making use of the weights, can extract command phrases from the filtered, digitized audio stream.

In another example, a sound processing system can include a transducer, a speech presence detector module (SPDM), and a background sound change trigger module (BSPCTM). The transducer can receive an audible, acoustic input and generate an electrical signal based on the audible input. The audible input can include voiced and non-voiced inputs. The SPDM can be connected to the transducer to receive the electrical signal from the transducer. The SPDM can provide a detection signal based on the detection of voiced input. The BSPCTM can be in communication with the transducer to receive the electrical signal from the transducer. The BSPCTM can provide a background change signal based on the detection of a change in the non-voiced input. The background change signal can be an interrupt signal. The BSPCTM can receive the electrical signal for a predetermined time interval. The BSPCTM can compare the non-voiced input to a predetermined threshold (e.g. volume and/or frequency).

The system can be configured to transition from a standby mode to an active mode in response to the detection signal, the background change signal, or both signals. The system can be configured to transition from the active mode to the standby mode after a given, predetermined period of time following entry into the active mode.

The system can include a status logic module that can receive the detection signal and the background change signal. When one or both of the detection signal and the background change signal is an interrupt signal, the status logic module can determine the origin of the received signal(s) (SPDM and/or BSPCTM), and provide a status based on the origins of the received signal(s). The status logic module can provide a first status if the detection signal is the interrupt signal and a second status if the background change signal is the interrupt signal. The status logic module can provide a third status if both the detection signal and the background change signal are interrupt signals. The status logic module can provide a zeroth status in response to an expiration of a predetermined time duration after receiving the interrupt signal.

In another example, a sound processing system can include a digital microphone, a decimation module, a front end processing module, a SPDM, a BSPCTM, a status logic module, and a buffer module. The digital microphone can receive an audible input and generate a PDM input sound stream samples based on the audible input. The audible input can include voiced and non-voiced inputs. The decimation module can receive the PDM input sound stream samples and convert the PDM input sound stream samples to PCM sound stream samples. The front end processing module can be connected to the decimation module. The front end processing module can generate an electrical signal based on the PCM sound stream samples. The SPDM can be connected to the front end processing module, receive the electrical signal, and provide a detection signal based on the detection of a voiced input in the electrical signal. The BSPCTM can be connected to the front end processing module. The BSPCTM can receive the electrical signal and provide a background change signal based on the detection of a change in the non-voiced input. The status logic module can be connected to the SPDM and the BSPCTM. The status logic module can receive the detection signal and the background signal, indicate a first status if the detection signal is an interrupt signal, and indicate a second status if the background change signal is an interrupt signal. The buffer module can be connected to the decimation module and can receive the PCM sound stream samples and selectively stream the PCM sound stream samples to an output of the buffer module when the status logic module indicates the first status or the second status. The status logic module can indicate a zeroth status when a predetermined time period expires after receiving an interrupt signal. The buffer module can be configured to cease streaming the PCM sound stream samples when the status logic module indicates the zeroth status.

In another example, a sound processing system can include a digital microphone, a decimation module, a feature extraction module, a SPDM, a noise estimation module, a BSPCTM, a status logic module, and a buffer module. The digital microphone can receive an audible input and generate PDM input sound stream samples based on the audible input. The audible input can include voiced and non-voiced input. The decimation module can receive the PDM input sound stream samples and convert the PDM input sound stream samples to PCM sound stream samples. The feature extraction module can receive the PCM sound stream samples and determine speech vectors based on the PCM sound stream samples. The SPDM can receive the speech vectors and detect speech based on the speech vectors. The SPDM can include a speech estimation module configured to estimate speech energy based on the speech vectors and a speech detection module configured to calculate a signal to noise ratio based on the speech energy. The noise estimation module can estimate background sound based on the speech vectors. The SPDM can also receive estimated background sound from the noise estimation module and calculate signal-to-noise ratio based on the background sound. The BSPCTM can receive the estimated background sound and provide a background sound change signal based on the detection of a change in the background sound. The BSPCTM can also calculate a delta variation of the estimated background sound, compare the delta variation to a predetermined threshold, and provide the background change signal based on the comparison. The status logic module can provide a status signal based on the communication with the SPDM and/or the BSPCTM. The buffer module can receive the PCM sound stream samples and the status signal and selectively stream the PCM sound stream samples to an output of the buffer module based on a status signal of the status logic module. The status signal can be an interrupt signal.

The status logic module can be configured to provide the status signal based at least in part on the expiration of a predetermined time period following receiving an interrupt signal from the SPDM and/or the BSPCTM.

An example method can include one or more of the following steps presented in no particular order. The method can include additional steps as would be appreciated and understood to a person of ordinary skill in the art. Detection criteria can be determined. Each of the detection criteria can be associated with a respective command instruction. A neural network can be hardwired based on the detection criteria such that the neural network is hardwired to receive an audio signal and/or video signal and select a command instruction based on the receive audio signal and/or video signal and based on the detection criteria. The detection criteria can include weights. When hardwiring the neural network, the neural network can be hardwired to include weighted paths. Each of the weighted paths can be associated with a weight.

The selected command instructions can be transmitted to an application processor.

The neural network can include a convolution neural network, a recurrent neural network, other suitable type of neural network, or a combination of the aforementioned neural networks.

The neural network can be hardwired to receive the audio signal such that the audio signal is an audio stream. The neural network can be hardwired to continuously monitor the audio stream to select the command instruction.

A VAD module can be configured to receive an audio stream and provide the audio signal to the neural network in response to detecting a voice in the audio stream, the audio signal being a portion of the audio stream.

A sound profile change trigger module can be configured to receive an audio stream and provide the audio signal to the neural network in response to detecting a change in a non-voiced sound in the audio stream, the audio signal being a portion of the audio stream.

Another example method can include one or more of the following steps presented in no particular order. The method can include additional steps as would be appreciated and understood to a person of ordinary skill in the art. An audio stream can be received. The audio stream can be monitored for the presence of a voice in the audio stream. The audio stream can be monitored for a change in non-voiced sound in the audio stream.

A state output can be generated based on the monitoring of the audio stream for the presence of the voice and the monitoring of the audio stream for the change in non-voiced sound. The audio signal can be transmitted based on the state output, the audio signal being a portion of the audio stream following the detection of the presence of the voice in the audio stream and/or the change in non-voiced sound.

The audio stream can be received as a PDM signal. The PDM signal can be converted to a PCM signal. The PCM signal can be monitored for the presence of a voice. The PCM can be monitored for a change in the non-voiced sound.

Another example method can include one or more of the following steps presented in no particular order. The method can include additional steps as would be appreciated and understood to a person of ordinary skill in the art. A sequence of vectors can be generated based on the audio stream such that the sequence of vectors is temporally correlated to the audio stream. The speech can be determined activated by analyzing the sequence of vectors within a first moving time window having a first time period. The non-voiced sound energy can be determined by analyzing the sequence of vectors within a second moving time window having a second time period longer than the first time period such that each vector in the sequence of vectors are each analyzed with both the first moving time window and the second moving time window. The speech energy can be compared to the non-voiced sound energy. A first interrupt signal can be generated based on the comparing of the speech energy to the non-voiced sound energy. A change over time in the non-voiced sound energy can be determined. A second interrupt signal can be generated based on the change over time in the non-voiced sound energy. A state output can be generated based on the first interrupt signal and the second interrupt signal. An audio signal (a portion of the audio stream) can be transmitted based on the state output.

The audio stream can be received as a PDM signal. The audio stream can be converted from a PDM signal to a PCM signal. The PCM signal can be monitored for the presence of a voice. The sequence of vectors can be generated based on the decimated audio stream such that the sequence of vectors is temporally correlated to the audio stream and/or decimated audio stream.

DETAILED DESCRIPTION

As used herein, an "audio signal" is understood to mean an electrical signal that is representative of a sound carried by acoustic waves. For instance, an "audio signal" can be an electrical signal provided by an acoustic transducer such as a microphone, an analogue electrical signal, a digital electrical signal, an analogue electrical signal that has been digitized, an electrical signal that has been amplified, an electrical signal that has been filtered, an electrical signal that has been sampled, and/or an electrical signal that has been decimated.

As used herein, an "audio stream" is understood to mean an "audio signal" that is continuously provided and/or generated. For instance, an "audio stream" can be an "audio signal" that is a real-time representation of acoustic waves impending on an acoustic transducer.

As used herein, an "video signal" is understood to mean an electrical signal that is representative of moving images and/or a sequence of images that form a video. For instance, a "video signal" can be an electrical signal provided by an imaging device such as a camera, an analogue electrical signal, a digital electrical signal, an analogue electrical signal that has been digitized, an electrical signal that has been amplified, an electrical signal that has been filtered, an electrical signal that has been sampled, and/or an electrical signal that has been decimated.

As used herein, an "video stream" is understood to mean a "video signal" that is continuously provided and/or generated. For instance, a "video stream" can be a "video signal" that is a real-time representation of visible activity occurring in the viewing range of a camera.

Figure 1:
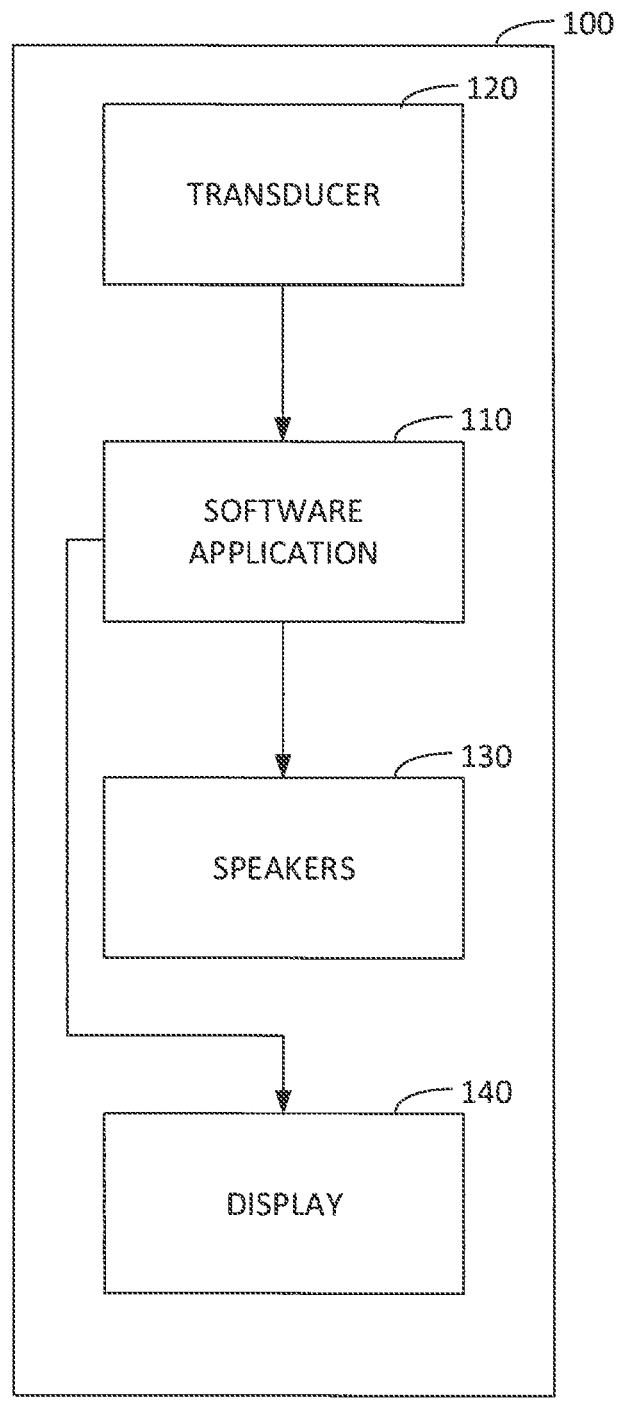
FIG. 1 illustrates a device that processes an audio input.

Referring to FIG. 1, one technique to provide input to a device 100, which is preferably a battery powered portable device, such as a smartwatch, a smartphone, a tablet computer, a remote controller, a computerized toy, and the like is to include a software application 110 that is continuously running on the portable device 100. Alternatively, the software application 110 may be running on the portable device 100 based upon a duty cycle process, where the software application is active for a fraction of a time period. The software application 110 may monitor a transducer 120, such as a microphone, on the portable device 100 to detect a key-phrase spoken by a user. The key-phrase may be, for example, "What Is The Weather". In response to sensing the key-phrase, the portable device 100 may tell the user the weather "It Is Currently Sunny" on the speakers 130 of the portable device. In response to sensing the key-phrase, the portable device 100 may indicate to the user the weather "It Is Currently Sunny" on a display 140 of the portable device. Unfortunately, the software application continuously running on the portable device tends to have relatively high power consumption resulting in relatively limited battery life. Typically, the processing on the device 100 includes a digital signal processor using techniques such as a Hidden Markov Models. Unfortunately, with the processing being performed on the device with relatively limited computational power, the accuracy tends to be relatively limited for a substantial set of potential commands.

Figure 2:
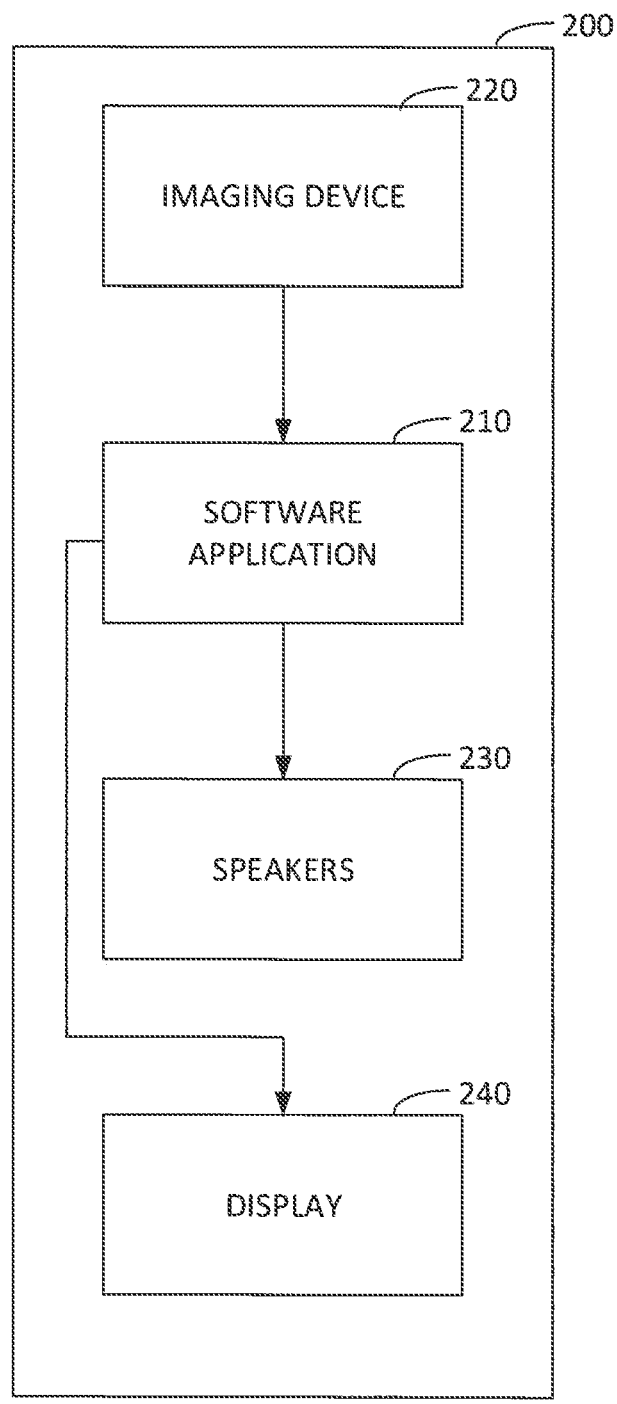
FIG. 2 illustrates a device that processes an image input.

Referring to FIG. 2, another technique to provide input to a device 200, which is preferably a battery powered portable device, such as a smartwatch, a smartphone, a tablet computer, a remote controller, a computerized toy, and the like is to include a software application 210 that is continuously running on the portable device 200. Alternatively, the software application 210 may be running on the portable device 200 based upon a duty cycle process, where the software application is active for a fraction of a time period. The software application 210 may monitor an imaging device 220, such as a camera, on the portable device 200 to detect an image or video of the surroundings. The image may be, for example, an intruder breaking into a house. In response to sensing the intruder breaking into the house, the portable device 200 may play an alarm signal on the speakers 230 of the portable device. In response to sensing the intruder breaking into the house, the portable device 200 may indicate to the user an alarm "Intruder Alert" on a display 240 of the portable device. Unfortunately, the software application continuously running on the portable device tends to have relatively high power consumption resulting in relatively limited battery life. Typically, the processing on the device 200 includes a digital signal processor using techniques such as a spatial filtering and Fourier transforms. Unfortunately, digital signal processing using spatial filtering and Fourier transforms on the digital signal processor with the processing being performed on the device with relatively limited computational power, the accuracy tends to be relatively limited for a substantial set of potential images.

Figure 3:
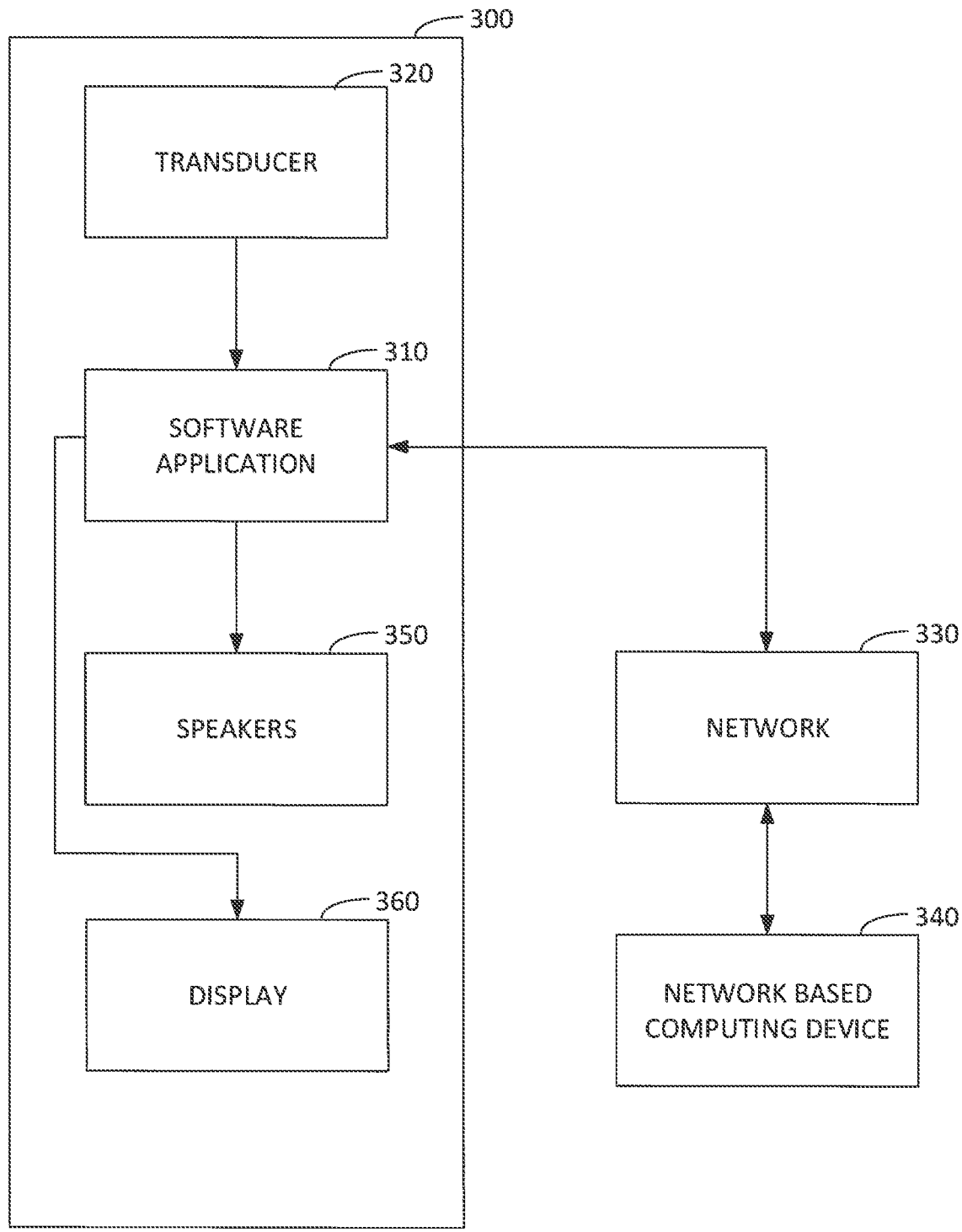
FIG. 3 illustrates a network based device that processes an audio input.

Referring to FIG. 3, another technique to provide input to a device 300, which is preferably a battery powered portable device 300, such as a smartwatch, a smartphone, a tablet computer, a remote controller, a computerized toy, and the like is to include a software application 310 that is continuously running on the portable device 300. Alternatively, the software application 310 may be running on the portable device 300 based upon a duty cycle process, where the application is active for a fraction of a time period. The software application 310 monitors a transducer 320, such as a microphone, on the portable device 300 to provide an audio stream from the transducer 320 through a network 330 (e.g., the Internet) to a network based computing device (e.g., a cloud server) 340. The network based computing device 340 detects a key-phrase spoken by a user. The key-phrase may be, for example, "What Is The Weather". In response to detecting the key-phrase, the network based computing device 340 may send a command to the portable device 300 to tell the user the weather "It Is Currently Sunny" on the speakers 350 of the portable device. In response to sensing the key-phrase, the portable device 300 may indicate to the user the weather "It Is Currently Sunny" on the display 360 of the portable device. Unfortunately, the software application continuously running on the portable device and the audio provided through the network connection tends to have relatively high power consumption resulting in relatively limited battery life. Unfortunately, transmitting the audio stream across the network compromises the user's privacy, and has limited reliability because of its dependence on limited network connectivity.

Figure 4:
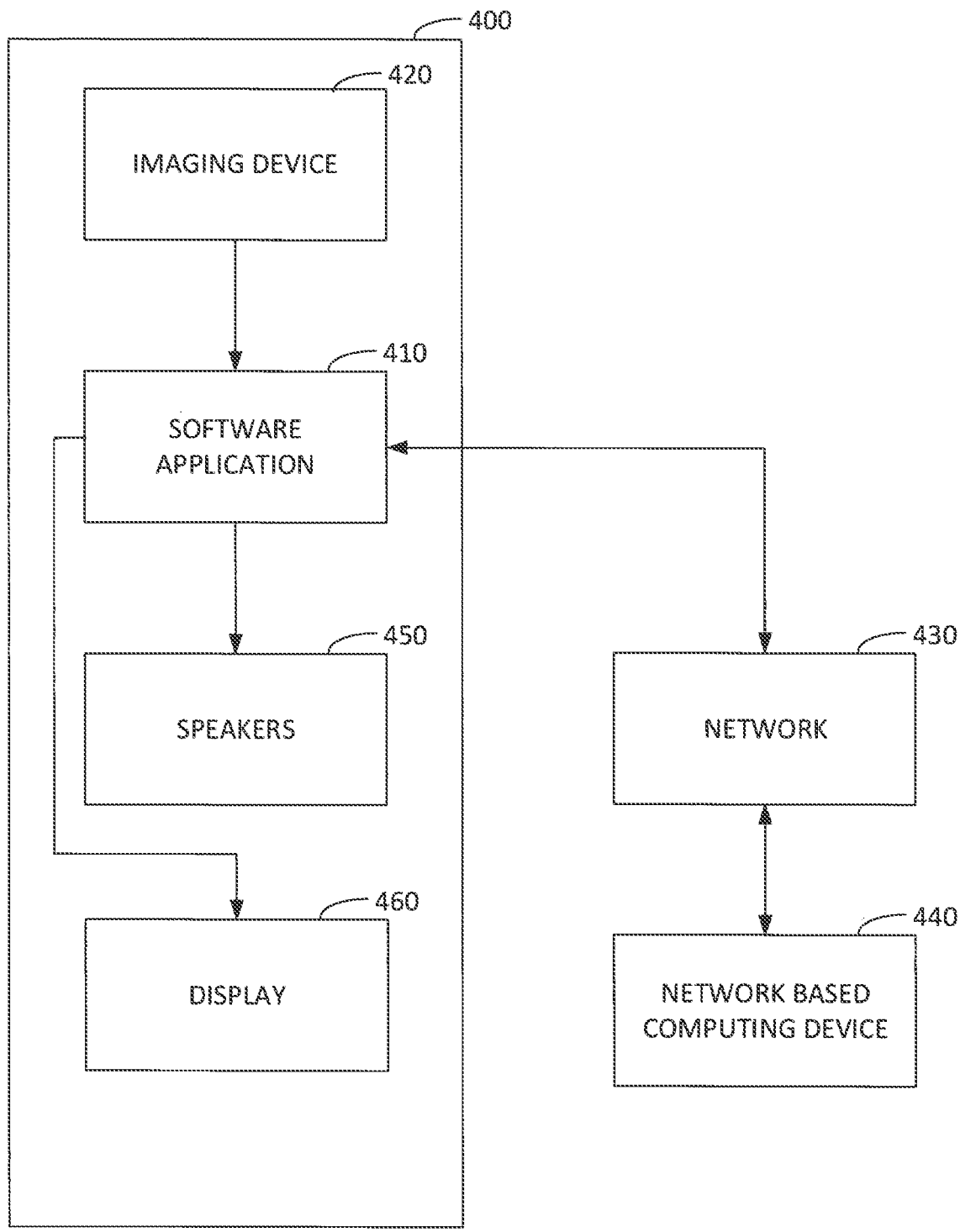
FIG. 4 illustrates a network based device that processes an image input.

Referring to FIG. 4, another technique to provide input to a device 400, which is preferably a battery powered portable device 400, such as a smartwatch, a smartphone, a tablet computer, a remote controller, a computerized toy, and the like is to include a software application 410 that is continuously running on the portable device 400. Alternatively, the software application 410 may be running on the portable device 400 based upon a duty cycle process, where the application is active for a fraction of a time period. The software application 410 monitors an imaging device 420, such as a camera, on the portable device 400 to detect an image or video of the surroundings. The image may be, for example, an intruder breaking into a house. In response to sensing the intruder breaking into the house, the portable device 400 may send from the imaging device 420 through a network 430 (e.g., the Internet) to a network based computing device (e.g., a cloud server) 440. The network based computing device 440 detects an intruder breaking into the house from the image and/or video. In response to detecting the intruder breaking into the house, the network based computing device 440 may send a command to the portable device 400 to play an alarm signal on the speakers 450 of the portable device. In response to sensing the intruder breaking into the house, the portable device 400 may indicate to the user an "Intruder Alert" on the display 460 of the portable device. Unfortunately, the software application continuously running on the portable device and the audio provided through the network connection tends to have relatively high power consumption resulting in relatively limited battery life. Typically, the processing on the device 400 includes a digital signal processor using at least some techniques such as a spatial filtering and Fourier transforms. Unfortunately,-transmitting the video stream across the network compromises the user's privacy, and has limited reliability because of its dependence on limited network connectivity.

Voice activity detection (VAD), also generally referred to as speech activity detection or speech detection, is a technique used for speech processing in which the presence of human speech or the lack thereof of human speech is detected. The principal applications for voice activity detection is for speech coding, speech processing, and speech recognition.

Various VAD techniques have been developed to provide different features. Each of the various VAD techniques include compromises, such as between latency, sensitivity, accuracy, and computational cost. Often the technique includes formulating a decision on a frame by frame basis using instantaneous measures of the divergence between the speech and the noise. There are many different divergence measures that may be used, such as for example, spectral slope, cepstral, correlation coefficients, weighted cepstral, log likelihood ratio, and modified distance measures.

In addition to the choice of the VAD technique, the system also typically makes a choice between having voice detected as noise or noise detected as voice (e.g., a choice between a false positive and a false negative). One example of a VAD technique to detect speech is described in Ramirez J, Segura J, Benitez C, De La Torre A, Rubio A: "Efficient voice activity detection algorithms using long-term speech information", in Speech Communications, Vol. 42, pp. 271-287, 2004, incorporated by reference herein in its entirety.

In general, each of the VAD techniques detect the presence of human speech or the absence of human speech. One advantage of using the VAD based technique includes lowering the system power because the system, or parts thereof, is maintained in an idle mode until speech is detected. Another advantage of using the VAD based technique includes securing the user privacy by blocking sound streaming until speech is detected, after which it enables a second stage that checks whether the user is addressing the device with a "wake word".

Figure 5:
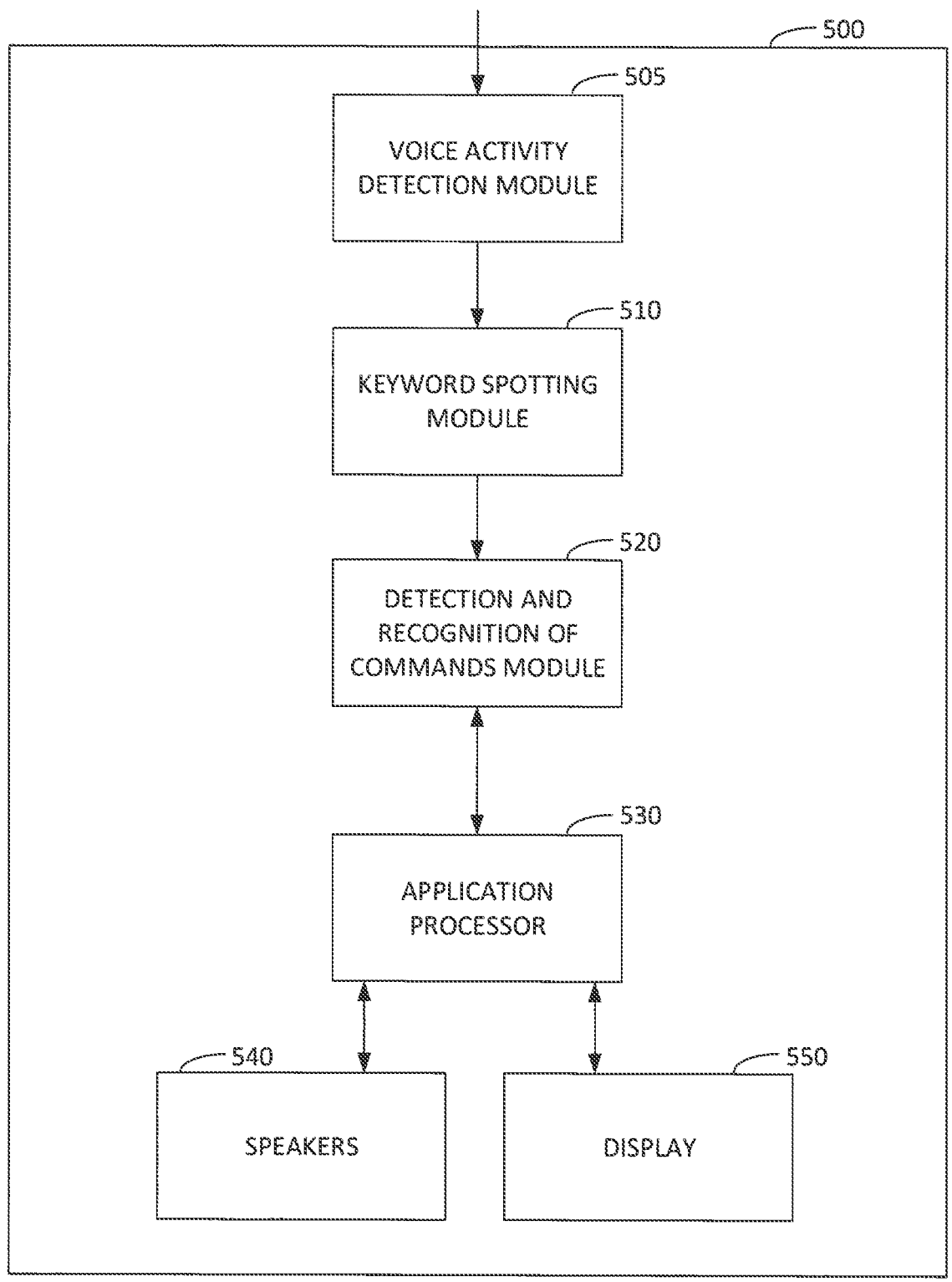
FIG. 5 illustrates a device that processes an audio input with voice activity detection.

Referring to FIG. 5, to reduce the power requirements, while still permitting the capability of receiving a voice command, the portable device 500 may include a voice activity detection (VAD) input module 505. The voice activity detection module 505 is preferably included within the device, such as a smartphone. Upon detecting the occurrence of voice activity by the voice activity detection module 505, a keyword spotting module 510 monitors the subsequent voice activity for a period of time for a keyword/ trigger word/wake-word or the like (generally referred to herein as a wake word). The keyword spotting module 510 is preferably included within the device, such as a smartphone. If such a wake word is not detected during the subsequent period of time, the system resumes its voice activity monitoring by the voice activity detection module 505 for the next voice activity. If such a wake word is detected during the subsequent period of time by the keyword spotting module 510, then the audio stream is processed by a detection and recognition of commands module 520 to detect and recognize subsequent commands during for a period of time. The subsequent commands are processed, and based upon the content indicating a desire to provide information, such as "Baymax What Is The Weather" (e.g., wake word is "Baymax" and command is "What Is The Weather"), a signal such as in the form of an interrupt is used to wake up an application processor 530 of the device. A software driver or a hardware logic is then enabled to a playback path including the speakers 540 to play a sound. The sound is preferably selected from samples stored in a memory or by an oscillator circuit, such as "It Is Sunny Outside". The software driver or the hardware logic is then enabled to a playback path including the display 550 to display an image. The image may be "It Is Sunny Outside". Preferably, the interface to the application processor includes GPIOs (e.g., general purpose input output) or with an additional interface to transmit a buffered data to the application processor for a second validation of the key phrase.

In some embodiments, the device 500 can further include a background sound profile change trigger such as disclosed herein in relation to FIG. 13 through FIG. 17. The background sound profile change trigger can be combined with the voice activity detection module 505, and the combined detection module 505 can be configured to provide an output state that is indicative of the type of detection (voice or sound). The keyword spotting module 510 can be configured to detect voice-based keywords if voice activity is detected at the detection module 505 and/or sound-based keywords if sound change is detected.

In some embodiments, the device 500 need not include a voice activity detection module 505. In such instances, the keyword spotting module 510 can continuously monitor an audio stream for the presence of a keyword or wake word rather than monitoring windows of time after being activated by the voice activity detection module 505. The keyword spotting module 510 can be customized as application specific to reduce power requirements.

Figure 6:
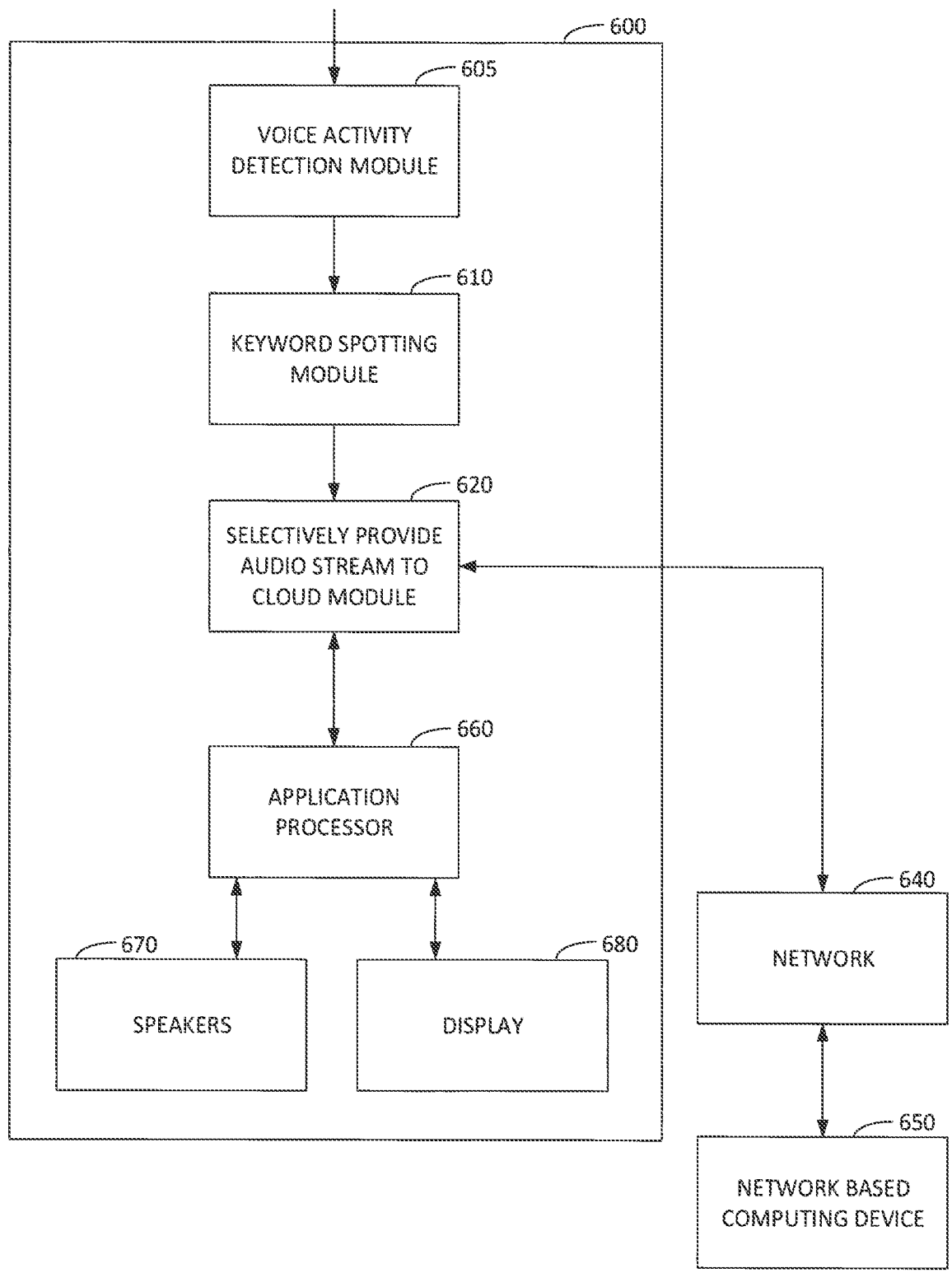
FIG. 6 illustrates a network based device that processes an audio input with voice activity detection.

Referring to FIG. 6, to reduce the power requirements, while still permitting the capability of receiving a voice command, a portable device 600 may include a voice activity detection (VAD) input module 605. The voice activity detection module 605 is preferably included within the device 600, such as a smartphone. Upon detecting the occurrence of voice activity by the voice activity detection module 605, a keyword spotting module 610 monitors the subsequent voice activity for a period of time for a keyword/trigger word/wake-word or the like (generally referred to herein as a wake word). The keyword spotting module 610 is preferably included within the device, such as a smartphone. If such a wake word is not detected during the subsequent period of time, the system resumes its voice activity monitoring by the voice activity detection module 605 for the next voice activity. If such a wake word is detected during the subsequent period of time by the keyword spotting module 610, then the audio stream is provided to a network based computing device 650 (e.g., Cloud based server) through a network 640 (e.g., Internet) by a selectively provide audio stream to cloud module 620. The network based computing device 650 processes the audio stream for any commands, and based upon the content of the commands indicating a desire to provide information, such as "Baymax What Is The Weather" (e.g., wake word is "Baymax" and command is "What Is The Weather"), a signal such as in the form of an interrupt is provided to an application processor 660 to wake up the application processor 660 of the device. A software driver or a hardware logic is then enabled to a playback path including the speakers 670 to play a responsive sound. The sound is preferably selected from samples stored in a memory or by an oscillator circuit, such as "It Is Sunny Outside". The software driver or the hardware logic is then enabled to a playback path including a display 680 to display an image. The image may be "It Is Sunny Outside". Preferably, the interface to the application processor includes GPIOs or with an additional interface to transmit a buffered data to the application processor for a second validation of the key phrase.

In some embodiments, the device 600 can further include a background sound profile change trigger such as disclosed herein in relation to FIG. 13 through FIG. 17. The background sound profile change trigger can be combined with the voice activity detection module 605, and the combined detection module 605 can be configured to provide an output state that is indicative of the type of detection (voice or sound). The keyword spotting module 610 can be configured to detect voice-based keywords if voice activity is detected at the detection module 605 and/or sound-based keywords if sound change is detected.

In some embodiments, the device 600 need not include a voice activity detection module 605. In such instances, the keyword spotting module 610 can continuously monitor an audio stream for the presence of a keyword or wake word rather than monitoring windows of time after being activated by the voice activity detection module 605. The keyword spotting module 610 can be customized as application specific to reduce power requirements.

It is desirable to include increased detection accuracy of an event from an input signal (e.g., audio content and/or voice activity and/or image content and/or a signal from a signal source and/or etc.) for an always on portable device, or a duty cycling process, while still maintaining relatively low power usage so that battery life is extended. Event may generally refer to voice activity or a specific spoken phrase/command, or appearance or existence of a specific visual or aural object, or receipt of a signal from a biological sensor, a physiological sensor, or any other type of sensor. It was determined that artificial intelligence, and more specifically deep learning, may be used to increase the accuracy of always on device (inclusive of devices with a duty cycling process) and further allow adaptability to existing conditions. Using artificial intelligence, and more specifically deep learning, may refer to using a deep neural network trained to perform an inference such as detecting or recognizing a particular event. The use of artificial intelligence, particularly in the format of an integrated circuit, decreases user privacy in the case that the artificial intelligence is being performed on a network based computing device because the data needs to be transferred to the network based computing device and data likely transferred from the network based computing device to the portable device. In addition, the transmission of data from the portable device through the network to the network based computing device, and then from the network based computing device through the network to the portable device, introduces significant latency in the responsiveness to the input signal. Moreover, the use of the network introduces reliability issues due to the intermittent ability of the network to effectuate transmissions. Also, general purpose artificial intelligence circuits tend to be very computationally intensive and thus require substantial power which limits battery usage. Moreover, configuring a general purpose artificial intelligence circuit tends to require complicated configuring of the topology and weights.

It was determined that it is preferable to provide an artificial intelligence circuit within the user's device (e.g., user's portable device inclusive of smart speakers, hearing aids, personal sound amplifiers, headphones, earbuds) that includes deep learning, which eliminates the privacy issues associated with sending data through the network, latency issues associated with sending and/or receiving data through the network to or from a network based computing device, and reliability issues associated with the transmission of data through an intermittent network. The deep learning technique may use multi-layered artificial neural networks to deliver increased accuracy. The deep learning facilitates automatically learning representations from data such as images, video, audio, and textual information, without the necessity of introducing hand-coded rules or human domain knowledge, albeit some hand-coded rules or human domain knowledge may be included, if desired. In this manner, the deep learning may primarily learn directly and continuously from the data with an increase in its inference accuracy when provided with more data. Any suitable deep learning framework may be used, such as TensorFlow and PyTorch. In addition, the circuit may include re-training support, if desired. Accordingly, the portable device may operate, in relevant respects, without the requirement of sending and/or receiving data from an external network.

It was further determined that a general purpose artificial intelligence circuit within the portable device that includes deep learning, is not the preferred hardware architecture because it requires significant power and tends to be costly and complicated to configure for a particular application. In contrast, it is preferable to use a customized circuit that includes an architecture optimized and customized for a particular use and application, which lowers the power requirements and tends to reduce the configuration complexity. By way of example, a customized architecture may refer to a fixed hardware neural network topology together with some fixed and/or programmable weights in the neural network. An optimized custom architecture may result in a less complicated neural network, i.e. a network with a smaller number of parameters/weights without substantially compromising from accuracy performance, and/or in increased robustness in noisy environments. In addition, limited weight programmability may be retained for neural network configuration and adaptability. Also, the neural network may include fixed activation functions, and including other customizable activation functions, as desired.

By way of example, a customized architecture may refer to custom topology per application, for example custom/fixed Long short-term memory (LSTM) network which are units of a recurrent neural network (RNN) or Gated recurrent unit (GRU) for voice application and custom/fixed convolutional neural network (CNN) for vision application. Other types of neural networks and combinations thereof can be utilized as would be appreciated and understood to a person of ordinary skill in the art. In this case, the system may fix the number of layers, the size of the input, the filter size and filter number of channels as well as the subsampling size. This customization assists with optimizing the cost and the power consumption of the chip.

The customized circuit with integrated deep learning is communicatively coupled to the sensor, such as the microphone, the imaging device, or otherwise, and detects the occurrence of a defined event. In response to detecting the occurrence of the defined event, the system notifies the other portions of the system, as appropriate, to provide a suitable response which may include triggering an operation. Preferably the notification is in the form of a level or edge based interrupt, although it may be any type of signal, or any type of data transfer.

The customized circuit may include neural network topology that includes a distribution of neurons (or processing nodes). The distribution of neurons may include a set of interconnections among the neurons. Through interconnections, nodes may receive data from other nodes (via incoming connections) or send data to other nodes (via outgoing connections). Interconnections may be assigned weights. The distribution of neurons may also be arranged in a set of multiple layers. Moreover, a subset or the entire set of weights of the neural network in the customized circuit may be reprogrammed. As a general matter, the customized circuit may include a fixed topology, such as the number of layers and the interconnections between the neurons, which are not reprogrammable in the customized circuit. Moreover, these limitations on the programmability of the customized circuit substantially decrease the power requirements while maintaining high accuracy for particularized applications, such as a limited voice and/or video recognition, by using a customized chip that is not substantially over-provisioned.

Figure 7A:
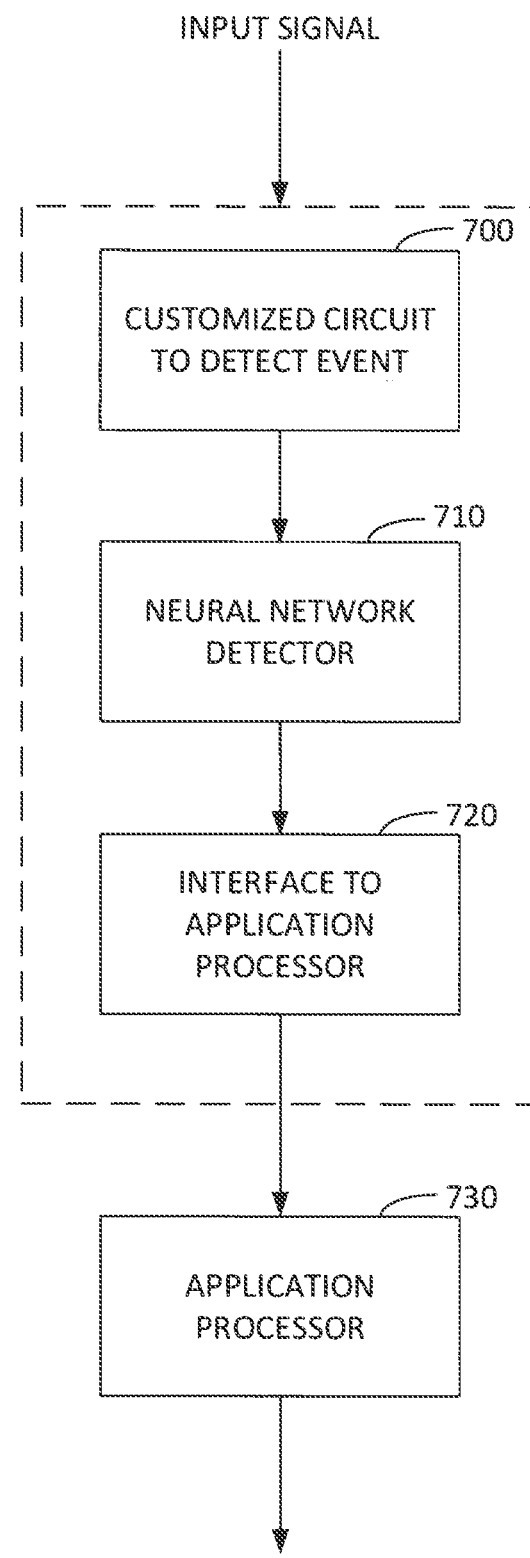
FIGS. 7A and 7B illustrate neural network based event detections.

The use of one or more customized circuit permits a more tailored technique for different system architectures, depending on the always on power requirements (including duty cycle process) and the desired false alarm rate. Referring to FIG. 7A, a customized circuit 700 to detect an event includes a detector 700 that can detect speech and/or sound and a neural network detector with deep learning 710. The detector 700 can configured to detect presence of a voice and/or a change in background noise. For instance, the detector can include a VAD such as disclosed above and otherwise disclosed herein, and/or the detector can include a background sound profile change trigger such as disclosed below in relation to FIG. 13 through FIG. 17. Additionally, or alternatively, the system illustrated in FIG. 7A can be configured for image processing and the detector 700 can include event triggering based on changes in an image stream. The event detector 700 and the neural network detector 710 can be included in a single electronic device, on a single printed circuit board, within a single package (e.g. a package mountable on a printed circuit board), and/or on a single chip as a system on a chip.

The neural network detector with deep learning 710 may pass the detected event to an interface to application processor 720. The application processor 720 can be included with the event detector 700 and the neural network detector 720 in a single electronic device, on a single printed circuit board, within a single package (e.g. a package mountable on a printed circuit board), and/or on a single chip as a system on a chip, if desired. The interface to application processor 720 interfaces with an application processor 730 of the device. Preferably, the interface to application processor 720 wakes up the application processor 730, at least with respect to the responsive application, with the detected event.

Figure 7B:
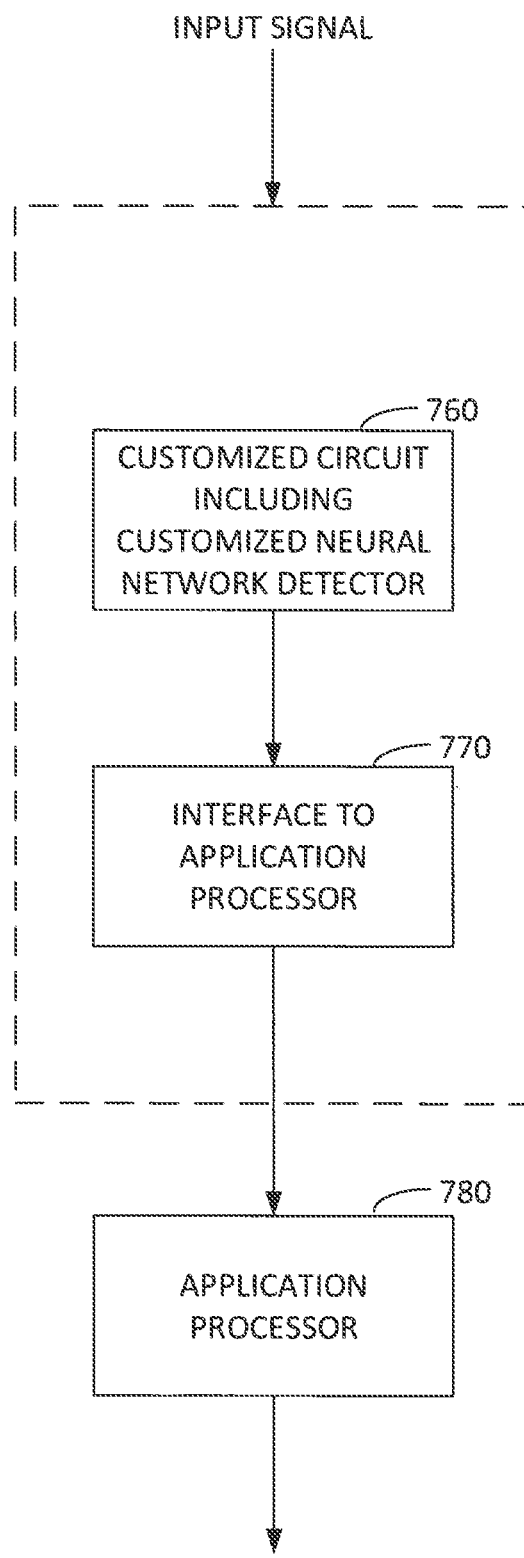

Referring to FIG. 7B, a customized circuit including a customized neural network detector 760 includes a neural network detector with deep learning. In contrast to the system illustrated in FIG. 7A, the customized circuit including the customized neural network detector 760 illustrated in FIG. 7B need not include an event detector 700 separate from a neural network detector 700 illustrated in FIG. 7A. The customized circuit 760 can include a circuit holistically customized for the detection of commands in an audio or video input signal to meet certain application-specific requirements. The customized circuit 760 can include a neural network with deep learning. The customized circuit 760 can be included in a single electronic device, on a single printed circuit board, within a single package (e.g. a package mountable on a printed circuit board), and/or on a single chip as a system on a chip.

The customized circuit 760 may pass the detected event to an interface to application processor 770. The customized circuit 760 and interface to application processor 770 can be included in a single electronic device, on a single printed circuit board, within a single package (e.g. a package mountable on a printed circuit board), and/or on a single chip as a system on a chip, if desired. The interface to application processor 770 interfaces with an application processor 780 of the device. Preferably, the interface to application processor 770 wakes up the application processor 780, at least with respect to the responsive application, with the detected event.

Figure 8A:
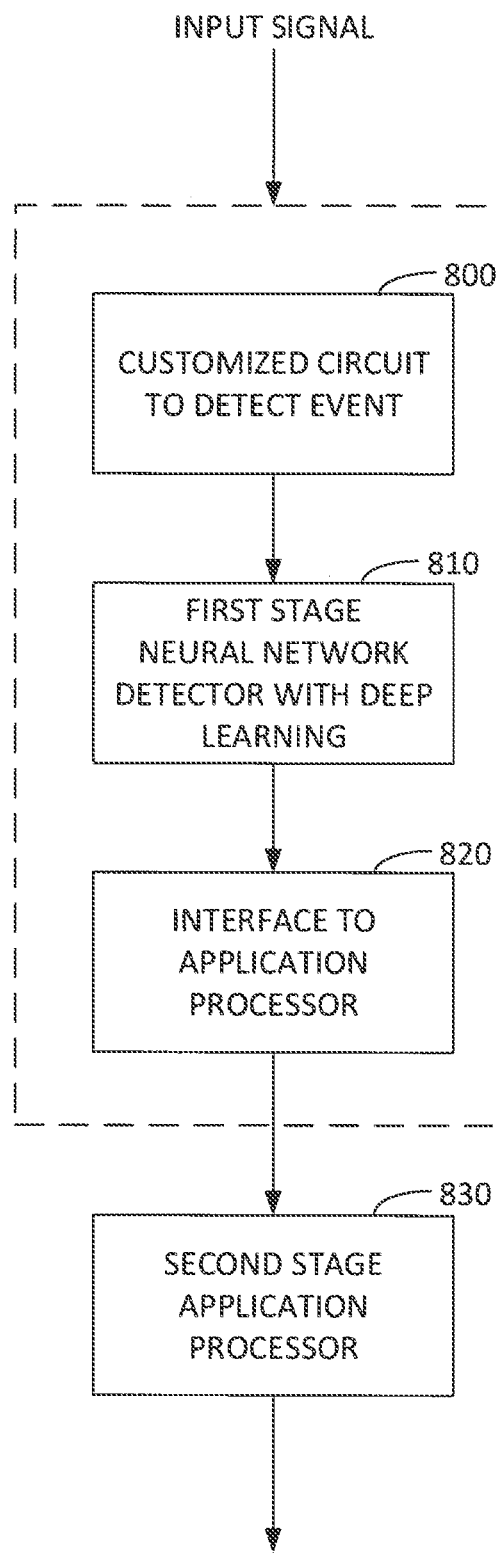
FIGS. 8A and 8B illustrate two stage based event detections.

Referring to FIG. 8A, a customized circuit 800 to detect an event includes a detector 800 that can detect speech and/or sound and a first stage neural network detector with deep learning 810. The detector 800 can be configured to detect presence of a voice and/or a change in background noise. For instance, the detector can include a VAD such as disclosed above and otherwise disclosed herein, and/or the detector can include a background sound profile change trigger such as disclosed below in relation to FIG. 13 through FIG. 17. Additionally, or alternatively, the system illustrated in FIG. 8A can be configured for image processing and the detector 800 can include event triggering based on changes in an image stream. The event detector 800 and the first stage neural network detector 810 can be included in a single electronic device, on a single printed circuit board, within a single package (e.g. a package mountable on a printed circuit board), and/or on a single chip as a system on a chip.

The first stage neural network detector 810 may pass the detected event to an interface to application processor 820. The application processor 820 can be included with the event detector 800 and the neural network detector 820 in a single electronic device, on a single printed circuit board, within a single package (e.g. a package mountable on a printed circuit board), and/or on a single chip as a system on a chip, if desired.

The first stage neural network detector with deep learning 810 may perform a coarse detection of an event. The interface to application processor 820 interfaces with a second stage application processor 830 of the device. Preferably, the interface to application processor 820 wakes up the second stage application processor 830, at least with respect to the responsive application, with the coarse detection of the detected event. The second stage application processor 830, and in particular a responsive application running on the second stage application processor 830, is initiated or otherwise triggered to perform a finer detection of the event. Accordingly, the detection of a particular event is based upon both the first stage 810 and the second stage 830. The second stage application processor 830 and/or the particular responsive application running on the second stage application processor 830 is preferably in an idle state until being "woke up" as a result of the identification of an event by the first stage coarse identification. Accordingly, the second stage will confirm or reject the detection of the first stage.

Comparing the system illustrated in FIG. 7A with the system illustrated in FIG. 8A, assuming both systems are configured with identical overall functionality, the first stage neural network detector 810 illustrated in FIG. 8A can be made to consume lower power compared to the neural network detector 710 illustrated in FIG. 7A because the first stage neural network 810 illustrated in FIG. 8A is configured for coarse detection (e.g. increased false alarm rates) compared to the neural network detector 710 illustrated in FIG. 7A.

Figure 8B:
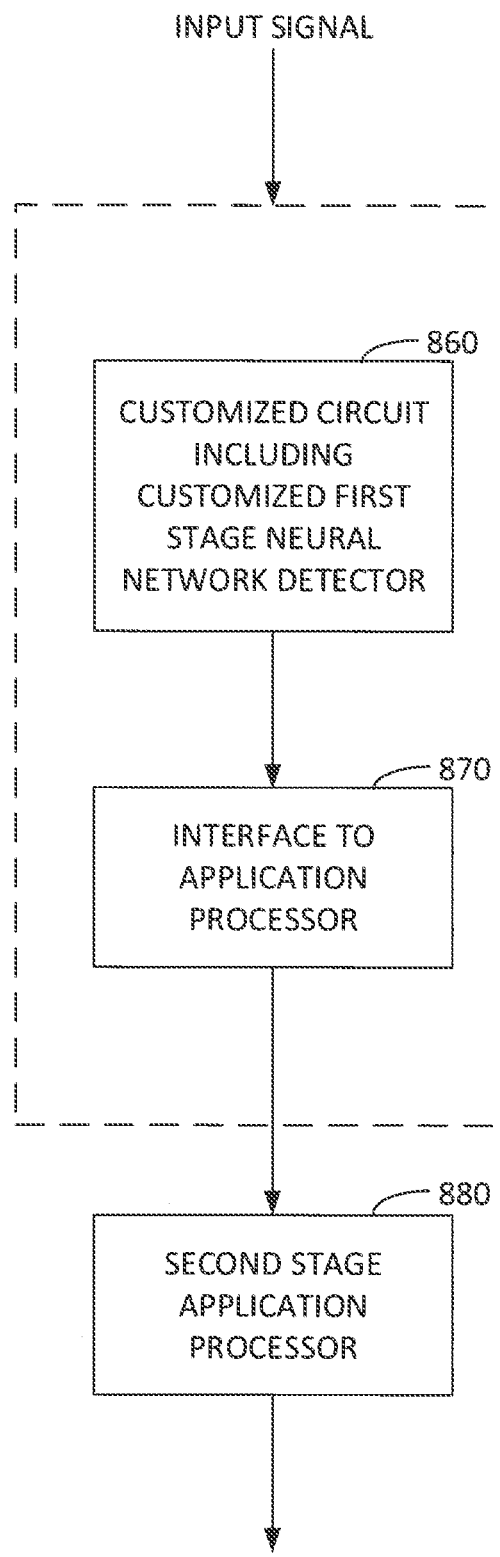

Referring to FIG. 8B, a customized circuit to detect an event includes a first stage neural network detector with deep learning 860. In contrast to the system illustrated in FIG. 8A, the customized circuit including the customized first stage neural network detector 860 illustrated in FIG. 8B need not include an event detector 800 separate from a first stage neural network detector 800 illustrated in FIG. 8A. The customized circuit 860 can include a circuit holistically customized for the detection of commands in an audio or video input signal to meet certain application-specific requirements. The customized circuit 860 can include a neural network with deep learning. The customized circuit 860 can be included in a single electronic device, on a single printed circuit board, within a single package (e.g. a package mountable on a printed circuit board), and/or on a single chip as a system on a chip.

The customized circuit including customized first stage neural network detector 860 may pass the detected event to an interface to application processor 870. The customized circuit 860 and interface to application processor 870 can be included in a single electronic device, on a single printed circuit board, within a single package (e.g. a package mountable on a printed circuit board), and/or on a single chip as a system on a chip, if desired. The customized circuit including customized first stage neural network detector 860 may perform a coarse detection of an event. The interface to application processor 870 interfaces with a second stage application processor 880 of the device. Preferably, the interface to application processor 870 wakes up the second stage application processor 880, at least with respect to the responsive application, with the coarse detection of the detected event. The second stage application processor 880, and in particular a responsive application running on the second stage application processor 880, is initiated or otherwise triggered to perform a finer detection of the event. Accordingly, the detection of a particular event is based upon both the customized circuit including customized first stage neural network detector 860 and the second stage 880. The second stage application processor 880 and/or the particular responsive application running on the second stage application processor 880 is preferably in an idle state until being "woke up" as a result of the identification of an event by the first stage coarse identification. Accordingly, the second stage will confirm or reject the detection of the first stage.

Comparing the system illustrated in FIG. 7B with the system illustrated in FIG. 8B, assuming both systems are configured with identical overall functionality, the customized first stage neural network detector 860 illustrated in FIG. 8B can be made to consume lower power compared to the customized circuit including neural network detector 760 illustrated in FIG. 7B because the first stage neural network detector 860 illustrated in FIG. 8B is configured for coarse detection (e.g. increased false alarm rates) compared to the customized circuit including neural network detector 760 illustrated in FIG. 7B.

The event detection circuit (or software) can be implemented using a digital signal processor and/or a neural network circuit. The processing can include feature extraction of the received audio signals, such as Mel-bands coefficients. The neural network may be implemented as a convolutional neural network or as a recurrent neural network, or any other suitable type of neural network including combinations of different type of neural networks. The voice command recognition techniques may be implemented in a standalone chip, in a codec chip, in the microphone, in the speaker, in an image capture device, or integrated in a power island in the application processor. As it may be observed, preferably the portable device includes all the processing necessary to provide the signal to the speakers or the display.

Other sensor based inputs may be used for the device, which is preferably a portable device, such as various inputs over wireless networks, a temperature based input, or a heath monitoring based input.

Once the customized circuit and/or the application processor has confirmed the existence of an event on the portable device, the application processor (or otherwise) may request additional information from the network based computing device. By way of example, the portable device may request that the network based computing device cause a door to open of a home. By way of example, the network based computing device may provide information back to the portable device, such as an audio stream of music. By way of example, the customized circuit may monitor images from a security camera to detect unknown faces, and once detected, notifies the application processor of the portable device and/or the network based computing device to post process the images and determine whether the unknown face is an intruder or not, and then to take further action accordingly.

As it may be observed, the privacy of the portable device is increased because the event detection does not require transmitting data across a network. Further, by including all the event detection on the portable device the latency is reduced and the reliability is increased because intermittent network connectivity does not impact event detection. In addition, the hardware data path preferably has a minimal programming requirement (e.g., data paths to a minimum set so that binding latencies are comparable to packet forwarding times).

Figure 9:
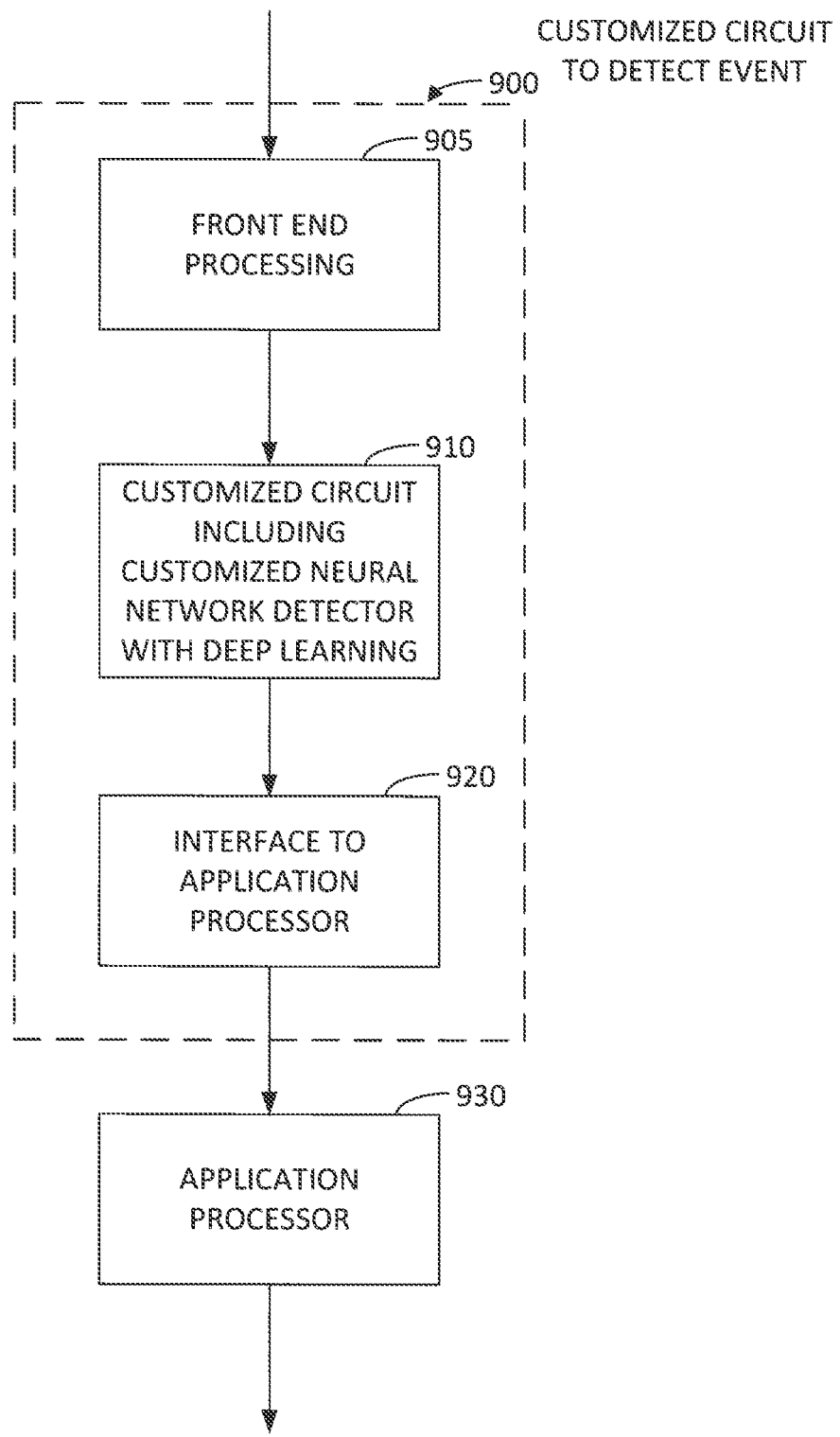
FIG. 9 illustrates another neural network based event detection.

Referring to FIG. 9, the customized circuit 900 preferably includes three principal sections, comprising both digital signal processing techniques and neural network based deep learning techniques to perform event detection. The first section may include front end processing 905 that is based upon a digital signal processing scheme to process the sensor input. The second section may include a customized neural network detector with deep learning 910. The neural network detection may include a hardware Datapath implanting a deep learning technique that may be implemented using a convolutional neural network, a recurrent neural network, or other type of a neural network. The customized circuit 910 can include a circuit holistically customized for the detection of commands in an audio or video input signal to meet certain application-specific requirements. The third section may include an interface to application processor 920, that sends both an interrupt and data to the application processor 930 for further processing, such as confirming the event or providing a suitable response (e.g. providing command instructions).

The system may be implemented using a computer-readable medium that may be any available medium that may be accessed by the processor. The computer-readable medium may include both a volatile and a nonvolatile medium, a removable and non-removable medium, and a storage medium. The storage medium may include RAM, flash memory, ROM, erasable programmable read-only memory (EPROM), electrically erasable programmable read-only memory (EEPROM), registers, hard disk, a removable disk, a compact disk read-only memory (CD-ROM), or any other form of storage medium. The processor may be operatively coupled via a bus to a display, such as a Liquid Crystal Display (LCD). The display may display information to the user. A keyboard and a cursor control device, such as a touch screen, can also be operatively coupled to bus to enable the user to interface with system.

The processor may be operatively coupled via the bus to one or more databases. The database may store data in an integrated collection of logically-related records or files. The database may be an operational database, an analytical database, a data warehouse, a distributed database, an end-user database, an external database, a navigational database, an in-memory database, a document-oriented database, a real-time database, a relational database, an object-oriented database, a NoSQL database, or any other database, or any combination thereof.

The memory may store software modules that provide functionality when executed in combination with the processor. The modules can include a data visualization module. The data visualization module may include a data visualization application that can collect, organize, synchronize, and display case data. The data visualization module may comprise a plurality of modules that each provide specific individual functionality for collecting, organizing, synchronizing, entering, modifying, and displaying data. The memory may also store an operating system. The operating system may provide operating system functionality for the system. The memory may also store one or more additional applications to include additional functionality for an overall system.

The system may include a customized Artificial intelligence neural network topology and programmable and/or fixed weights to expand the classification to Voice and Audio. For example, the classification may include keyword spotting, key-phrase spotting, song detection or a specific sound detection such as a baby crying, fire alarm, tornado alarm, siren, etc.

The custom topology may combine techniques from convolutional neural network, recurrent neural network, any other suitable type of neural network, or any combination of the aforementioned networks as would be appreciated and understood by a person of ordinary skill in the art to allow voice and audio classification at high accuracy, low power, and low-cost.

Figure 10:
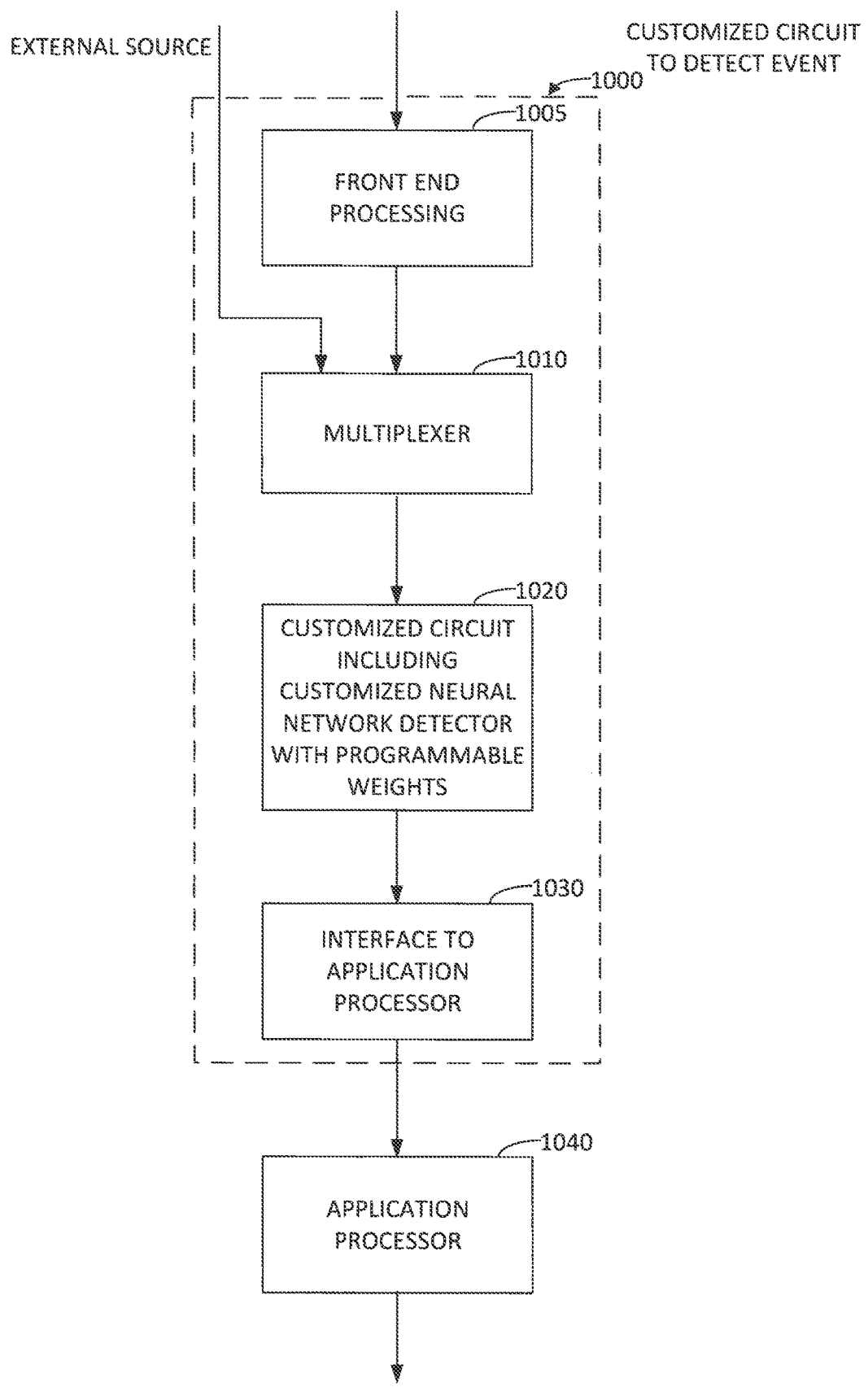
FIG. 10 illustrates a neural network based event detection with selectable input.

Referring to FIG. 10, the customized circuit 1000 preferably includes four principal sections, comprising both digital signal processing techniques and neural network based deep learning techniques to perform event detection. The first section may include front end processing 1005 that is based upon a digital signal processing scheme to process the input signals from the sensor. The second section may include a multiplexer that selects one of several extracted feature set input signals either coming from a local front-end processing 1005 or from an external source (i.e., application processor) and forwards the selected input into a single line. The multiplexer of inputs has a select line, which is used to select which input line to send to the output. The third section may include a customized neural network detector with deep learning 1020. The neural network detection may include a hardware data path implementing a deep learning technique that may be implemented using a convolutional neural network, a recurrent neural network, or any other type of a neural network to detect an event. The third section may include an interface to application processor 1030, that sends both an interrupt and data to the application processor 1040 for further processing, such as confirming the event or providing a suitable response.

Figure 11A:
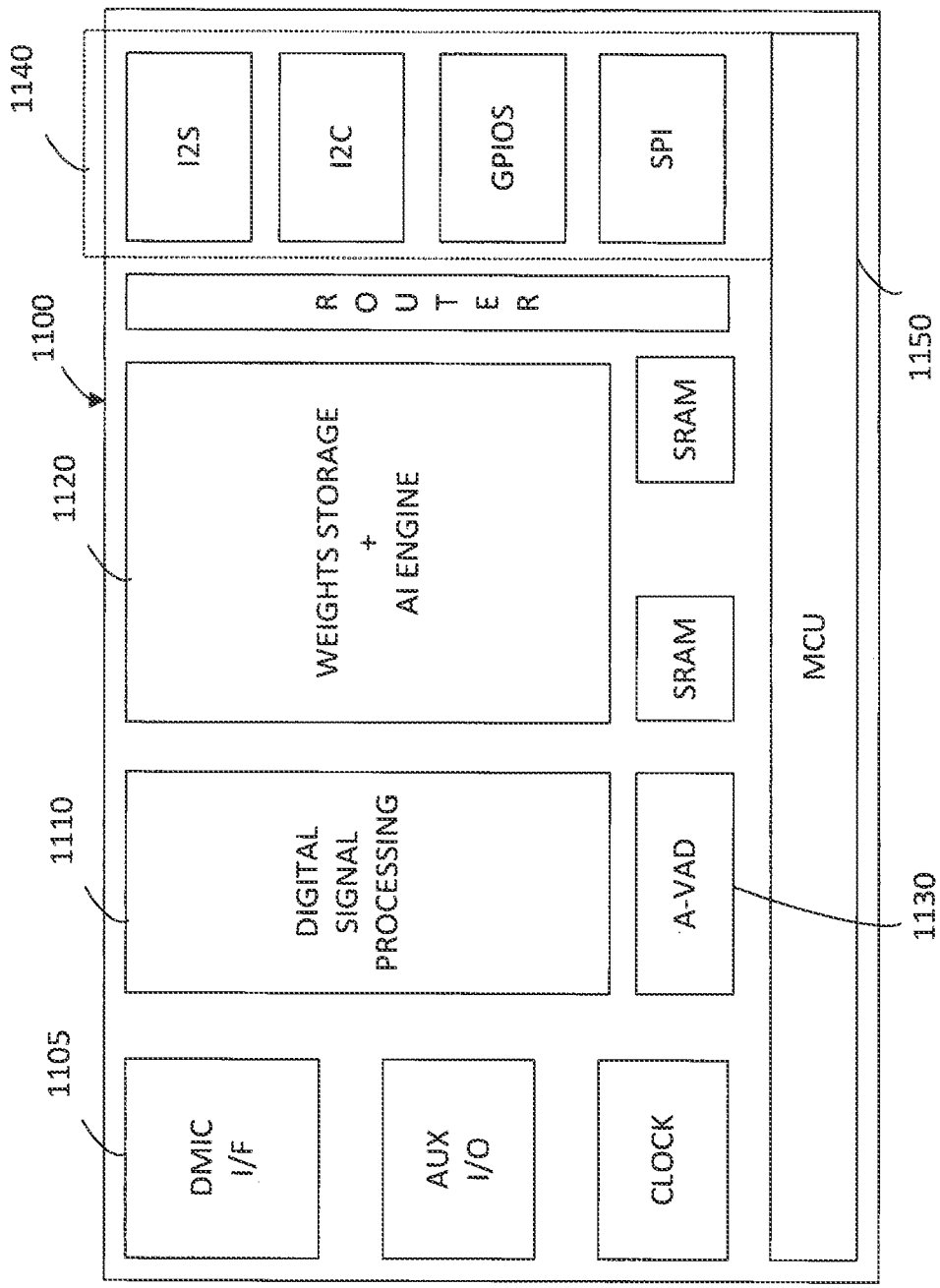
FIG. 11A illustrates an example of voice and audio custom deep learning chip architecture.

Referring to FIG. 11A an example of a Voice and Audio energy efficient custom deep learning chip 1100 can include an interface 1105 to digital microphone to receive the pulse density modulation signal, a digital signal processing block 1110 that can include decimation to pulse code modulation format and feature extraction such as Mel-bands features, a weight storage and AI engine block 1120 which can include the custom neural network topology, an event detection block 1130, audio and control interfaces 1140 (such as Inter-IC sound, inter-IC, general purpose input output and serial peripheral interface), and a microcontroller 1150.

Further, in some embodiments, such as described in relation to FIG. 7A and FIG. 8A, the event detection block 1130 can configured to detect presence of a voice and/or a change in background noise. For instance, the detector can include a VAD such as disclosed above and otherwise disclosed herein, and/or the detector can include a background sound profile change trigger such as disclosed below in relation to FIG. 13 through FIG. 17.

Additionally, or alternatively, the system illustrated in FIG. 11A can be configured for image processing. The system can include an input for receiving streaming video in place of, or in addition to the interface 1105 to the digital microphone. The event detection block 1130 can include event triggering based on changes in an image stream, and the AI engine block 1120 can be configured to provide commands based on the streaming video. The image may be, for example, an intruder breaking into a house. In response to sensing the intruder breaking into the house, the AI engine can provide commands to cause speakers to provide an audible alarm.

Figure 11B:
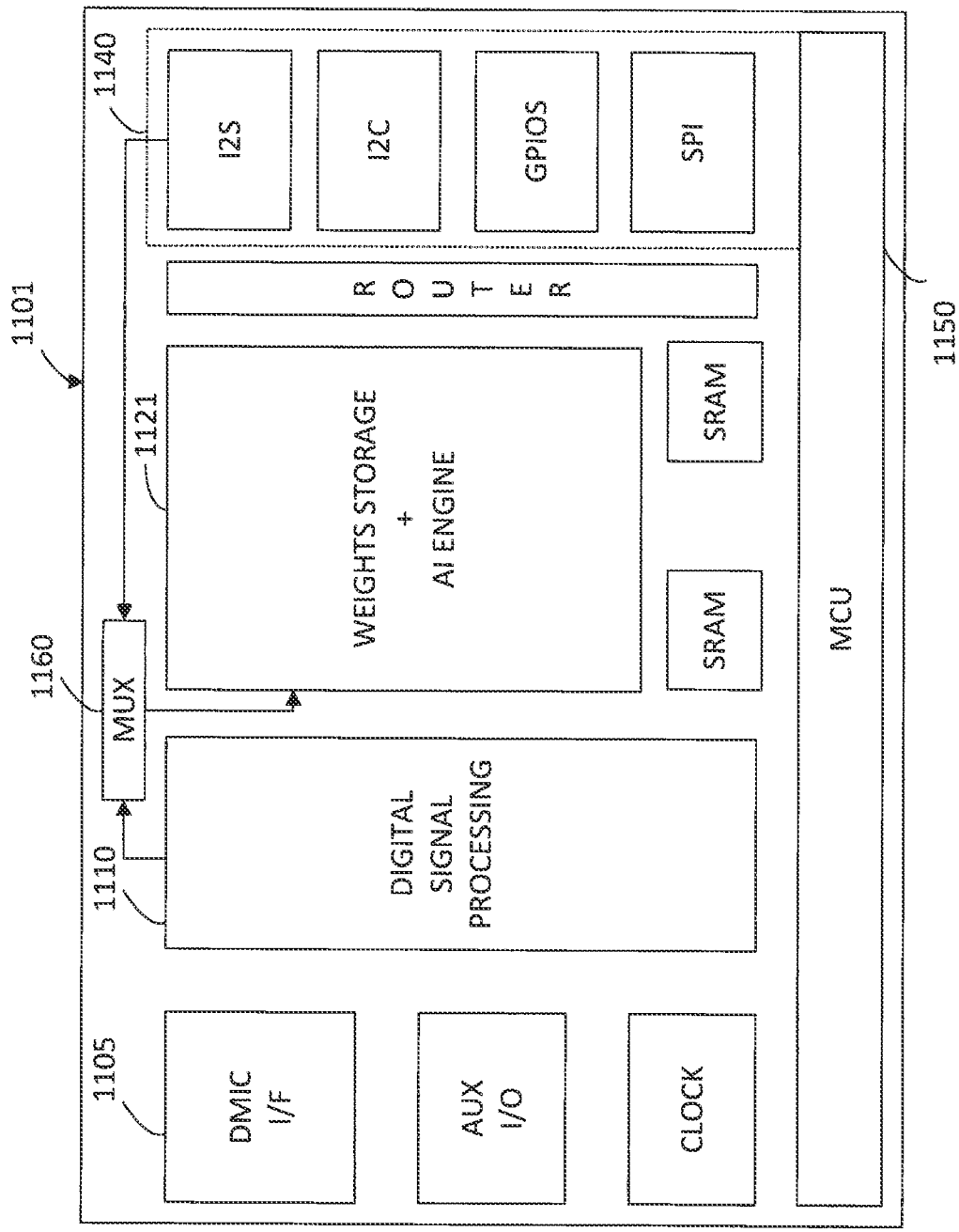
FIG. 11B illustrates another example of voice and audio custom deep learning chip architecture.

Referring to FIG. 11B an example of a Voice and Audio energy efficient custom deep learning chip 1101 can include an interface 1105 to digital microphone to receive the pulse density modulation signal, a digital signal processing block 1110 that can include decimation to pulse code modulation format and feature extraction such as Mel-bands features, a weight storage and AI engine block 1121 which can include the custom neural network topology, audio and control interfaces 1140 (such as Inter-IC sound, inter-IC, general purpose input output and serial peripheral interface), and a microcontroller 1150.

Comparing the chip 1101 illustrated in FIG. 11B with the chip 1100 illustrated in FIG. 11A, the chip 1101 illustrated in FIG. 11B need not include an event detection block 1130 illustrated in FIG. 11A. The AI engine block 1121 illustrated in FIG. 11B can be a customized circuit holistically customized for the detection of commands in an audio or video input signal to meet certain application-specific requirements.

The chip 1100 can include the four principal sections of the circuit 1000 illustrated in FIG. 10. The front end processing section 1005 of FIG. 10 can be realized by the digital signal processing block 1110 illustrated in FIG. 11B. The front end processing section 1005 of FIG. 10 can also include the interface 1105. The customized circuit including custom neural network detector with deep learning section 1010 of FIG. 10 can be realized by the AI engine block 1121 illustrated in FIG. 11B. The interface to application processor section 1020 of FIG. 10 can be realized by the audio and control interfaces 1140 illustrated in FIG. 11B. The multiplexer 1010 of FIG. 10 can be realized by the multiplexer 1160 illustrated in FIG. 11B.

Alternatively, the chip 1100 need not include multiplexer 1160, and in such embodiments, the chip 1100 can include the three principle sections of the circuit 900 illustrated in FIG. 9. The front end processing section 905 of FIG. 9 can be realized by the digital signal processing block 1110 illustrated in FIG. 11B. The front end processing section 905 of FIG. 10 can also include the interface 1105. The customized circuit including custom neural network detector with deep learning section 910 of FIG. 9 can be realized by the AI engine block 1121 illustrated in FIG. 11B. The interface to application processor section 920 of FIG. 9 can be realized by the audio and control interfaces 1140 illustrated in FIG. 11B. The multiplexer 910 of FIG. 9 can be realized by the multiplexer 1160 illustrated in FIG. 11B.

Figure 12:
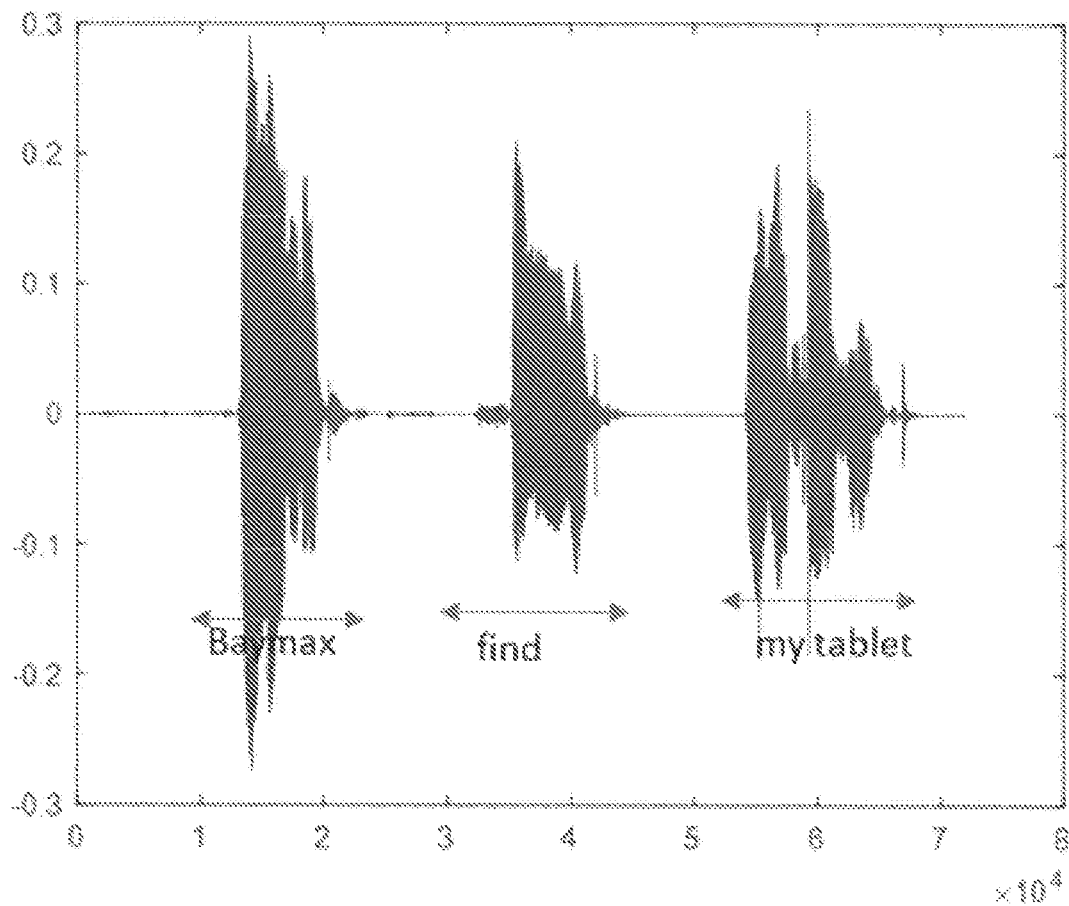
FIG. 12 illustrates a key-phrase detection.

Referring to FIG. 12, an example is illustrated of the key-phrase "Baymax find my tablet". The key-phrase includes a wake word, "Baymax" and a command phrase "find my table". VAD and other voice recognition techniques are focused on the detection of voice signals, such as illustrated in FIG. 12, and such systems typically filter out the background noise to facilitate identification of voice signals. Typically, while performing the filtering, such systems operate in an idle mode with much of the device's power consuming functions being disabled or otherwise in a standby state. This functionality is implemented to reduce system power consumption. Reducing power consumption is important for extending the battery life of battery powered devices, such as mobile phones. It is desirable to limit the current consumption of an always on system to about 1 mA or less at battery voltage (e.g. lithium ion battery voltage, alkaline battery voltage, etc.).

Figure 13:
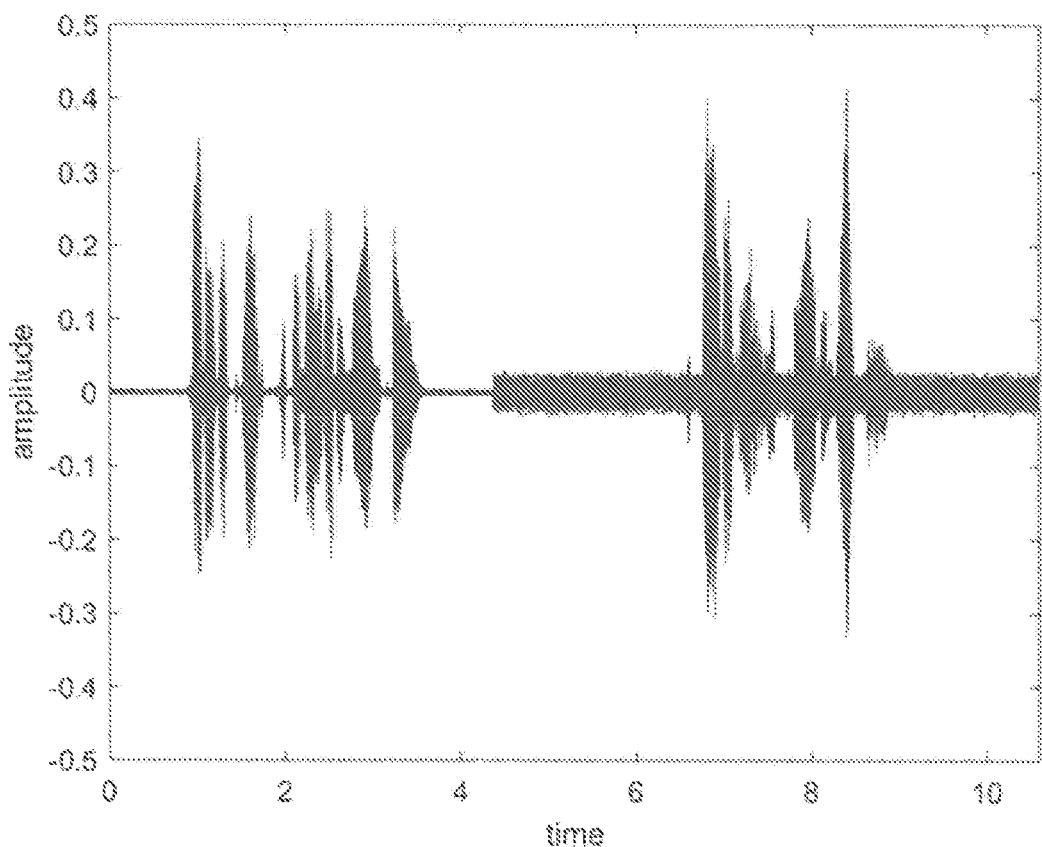
FIG. 13 illustrates a noise profile change.

Referring to FIG. 13, after further consideration of the existing VAD techniques it was determined that the background noise, which is suppressed or otherwise filtered out as undesirable noise, may otherwise provide context awareness information. The context awareness information may work in combination with the VAD. In contrast to the traditional technique of suppressing or otherwise filtering out background noise, it was determined that the background noise should be processed in a manner to determine relevant changes in the characteristics of the background noise, such as background sound profile changes. The processing of the background noise to determine relevant changes in its characteristics may be performed in parallel to the VAD detection technique, or otherwise as part of the VAD detection technique.

In addition to processing the background noise to determine relevant changes in the characteristics of the background noise, such as background sound profile changes, the background noise may be selectively streamed to a local processor and/or a network based computing device, such as a server accessible by the Internet. The background noise may be used for realizing context awareness, where the context that is determined may be used for subsequent adaptation of other processes to the particular content.

In addition, as a result of the VAD detection technique, the audio content may be selectively streamed to a local processor and/or a network based computing device, such as a server accessible by the Internet. The audio content may be used for interactions with the device, the user of the device, or other devices.

Context awareness based upon determining relevant changes in the characteristics of the background noise may be used to enable intelligent marketing, targeted advertising, and product and service recommendations. For example, the system may desire to detect via the smartphone when the user enters a music concert and analyze the data to recognize the type of music to further recommend commercial products to the user. In addition, the context awareness based upon determining relevant changes in the characteristics of the background noise may be coupled with geographic location information (e.g., GPS information) to further enable intelligent marketing, targeted advertising, and product and service recommendations. In addition, the context awareness based upon determining relevant changes in the characteristics of the background noise may be coupled with speed/velocity based information (e.g., walking speed, running speed, driving in car speed, airplane speed) to further enable intelligent marketing, targeted advertising, and product and service recommendations.

Another advantage to determining relevant changes in the characteristics of the background noise is improving the performance of processes, such as noise reduction techniques, by adapting them according to background when speech is present.

For example, the user may go from his quiet house to his car, and VAD in user's smartphone will detect the noise level change from quiet to car noise. The smartphone may then wakeup and feed the data to the application processor of the smartphone. Further analysis of this background data assists other applications to infer that the use is in the car and further enable car related intelligent marketing. In another case, the application could provide the information to the adaptive techniques deployed in the audio capture and playback to enhance the user experience.

Figure 14:
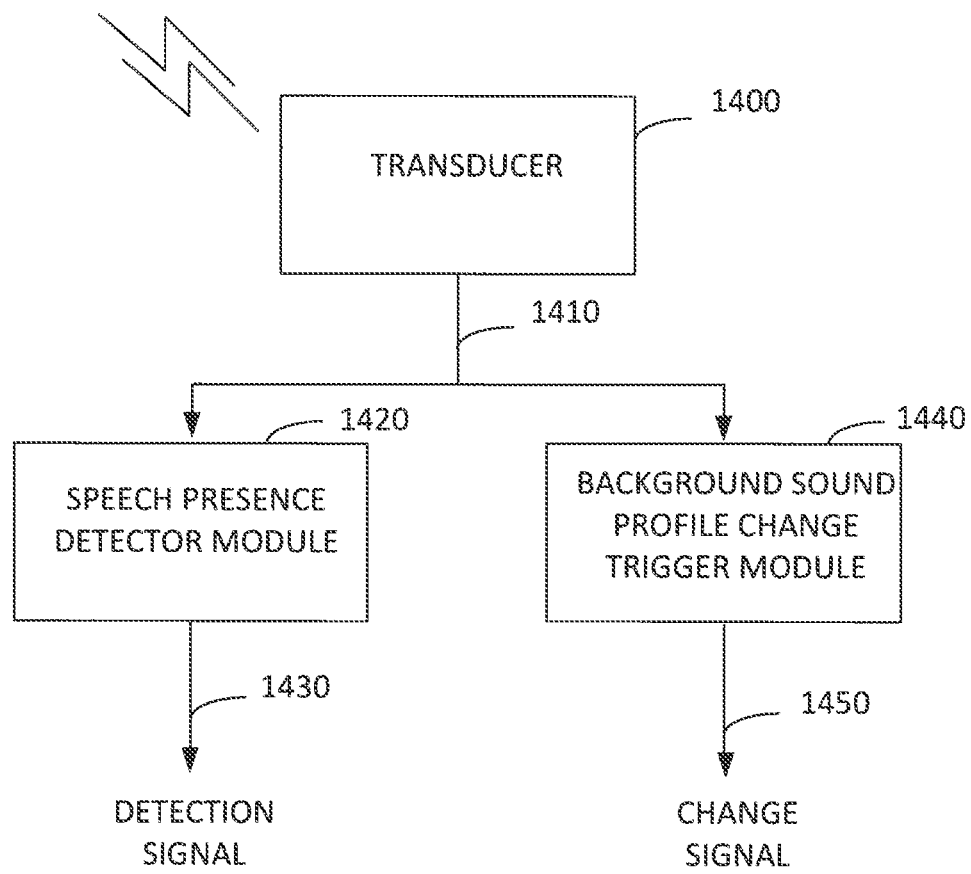
FIG. 14 illustrates a system with a speech presence detection and a background sound profile change trigger.

Referring to FIG. 14, the sound processing system may include a transducer 100, that senses analog sound signals, such as from the voice of a user, and generates an input signal 1410 in response thereto. The input signal 1410 is provided to a speech presence detector module 1420 which may be any suitable type of voice activity detector. The speech presence detector module 1420, which upon detecting speech, may provide a detection signal 1430, such as in the form of an interrupt. The input signal 1410 may also be provided to a background sound profile change trigger module 1440. The background sound profile change trigger module 1440 module may determine when the background noise has sufficiently changed. The background sound profile change trigger module 1440, which upon determining such a change has occurred, may provide a change signal 1450, such as in the form of an interrupt. The background sound profile change trigger module 1440 extracts the background sound from the input signal 1410, and then the extracted background sound is analyzed and tracked to detect any profile changes over a time interval. Preferably the input signal 1410 incudes data streaming to the background sound profile change trigger module 1440 for a predetermined time interval, e.g., a few seconds based on a pre-programmed time window. By way of example, the estimated background sound profile may be used to track the changes, such as when significant changes are detected via comparison to some defined thresholds. When a significant change occurs the change signal 1450, such as an interrupt, is provided to indicate such events. For example, the mechanism may utilize slow time constants to avoid false triggering based on non-stationary noise changes.

Based upon either the detection signal 1430 or the change signal 1450, or a combination of both, the system may wake up to further analyze the audio input and/or the background noise.

Figure 15:
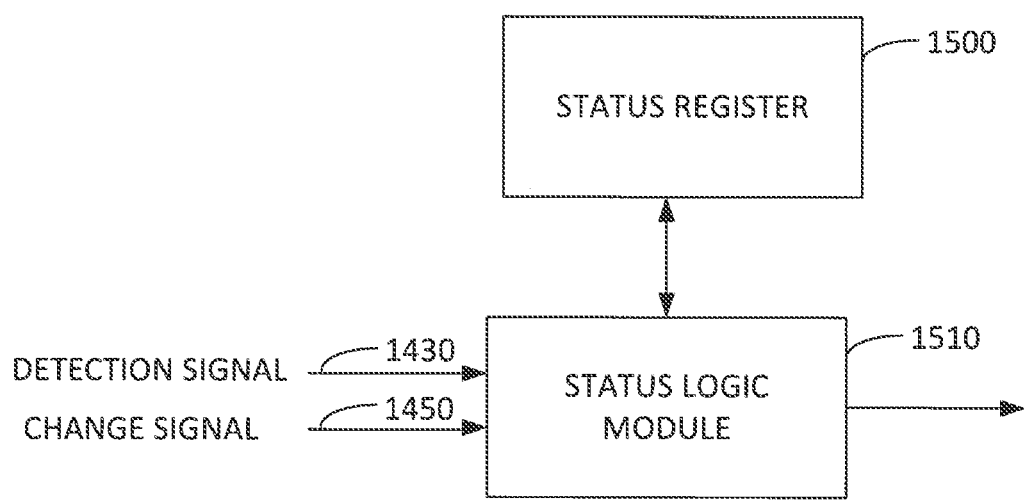
FIG. 15 illustrates a status logic module and a status register.

Referring to FIG. 15, in the event that an interrupt (or other signal) is used the system may include a status register 1500 that indicates the source of the interrupt. The status register 1500 may be based upon a status logic module 1510 which may indicate a first status if the source of the interrupt (or other signal) is the detection signal 1430. The status register 1500 may include a second status if the source of the interrupt (or other signal) is the change signal 1450. The status register 1500 may include a third status if the source of the interrupt (or other signal) is an "or" of the detection signal 1430 and the change signal 1450.

In the preferred implementation, the system includes a programmable time window to select the temporal duration of data streaming post a change signal and/or a detection signal. Once the duration is expired, the system preferably returns to sleep and VAD will continue searching for the next event, which could be either speech or a change in background sound profile. In addition, when the change signal 1450 is triggered then the VAD (e.g., wake word detector) is bypassed, and the data is streamed directly to the processor or network based device for further analysis.

Figure 16:
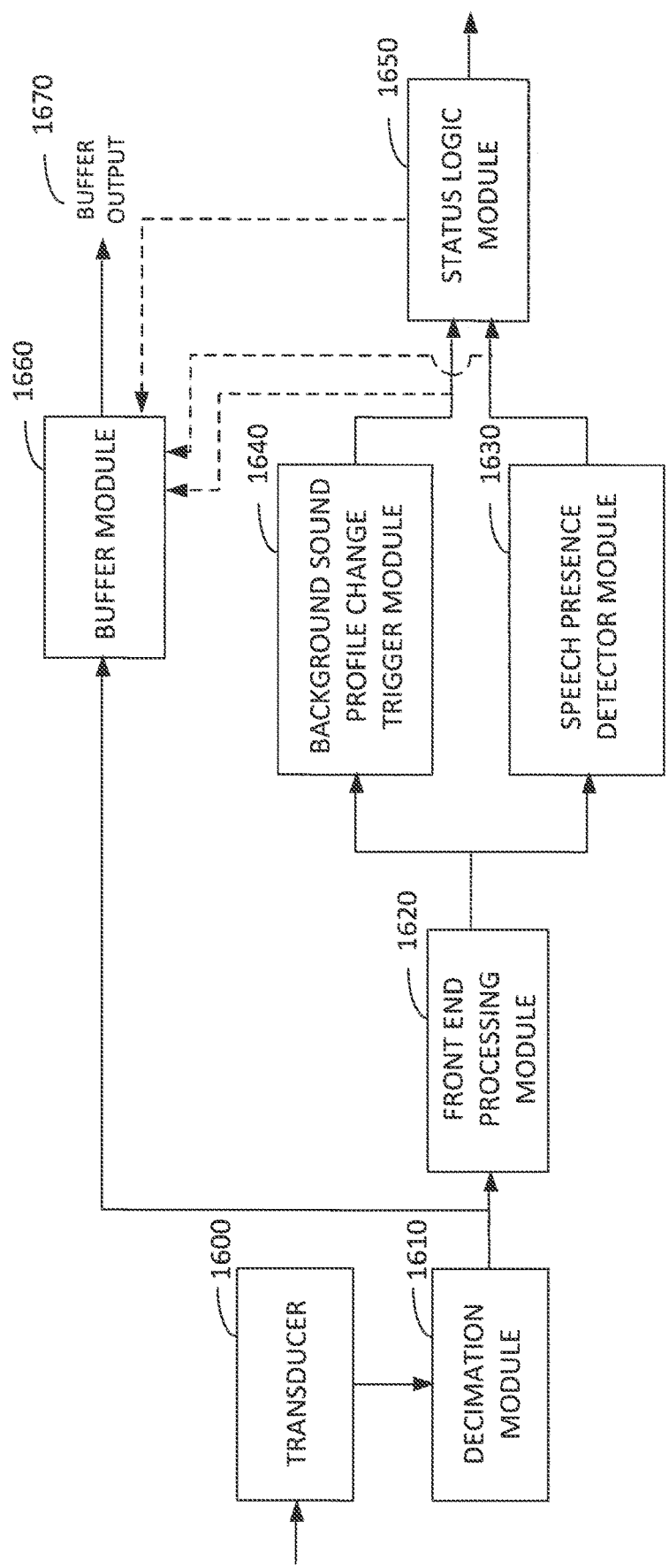
FIG. 16 illustrates a VAD technique with embedded background sound profile change trigger.

Referring to FIG. 16, one implementation may include a decimation module 1610, if desired, that performs decimation of the input sound stream samples from a pulse density modulation (PDM) domain to a pulse code modulation (PCM) domain from a transducer 1600. For example, the pulse density modulation signal may be obtained from a digital microphone or from an analog-to-digital converter receiving an analog signal from an analog microphone. The output of the decimation module 1610 may be provided to a front end processing module 1620. A speech presence detector 1630 may receive an input from the front end processing module 1620, which may be any suitable type of voice activity detector. A BSPCT module 1640 may receive an input from the front end processing module 1620, which may determine any suitable type of relevant change in the characteristics of the background noise. The output of the BSPCT module 1640 and the speech presence detector 1630 may be provided to a status logic module 1650. The status logic module 1650 may provide a signal, which may be in the form of an interrupt, that indicates which signal is active or whether one of the signals is active. The status logic module 1650 may be as described with respect to FIG. 14. A buffer module 1660 may receive the output of the decimation module 1610 which is selectively provided to a buffer output 1670, based upon an output of the logic module 1650. For example, when the speech presence detector module 1630 detects speech and/or the BSPCT module 1640 detects an event, the buffer module 1660 may provide an output stream for subsequent processing. In addition, the buffer module 1660 may be a catch-up buffer that stores the sound data chopped off due to the VAD latency.

In some embodiments, modules 1610, 1620, 1630, 1640, 1650, 1660 can be included in an event detection module 505, 605, 700, 800, 1130 such as illustrated herein respectively in FIGS. 5, 6, 7A, 8A, and 11A. The decimation module 1610 receive an input signal such as described in relation to FIGS. 5, 6, 7A, 8A, and 11A. The buffer module 1160 can provide a buffer output 1670 to a keyword spotting module 510, 610, neural network detector 710, 810, or AI engine block 1120 which can process the buffered input signal according to the teachings of the present disclosure. The status logic module 1650 can provide an output that indicates if a voice and/or sound event is detected. Based on the indication provided from the status logic module 1650, the keyword spotting module 510, 610, neural network detection 710, 801, or AI engine block 1120 can be configured to search for a sound-based keyword or a voice-based keyword.

Figure 17:
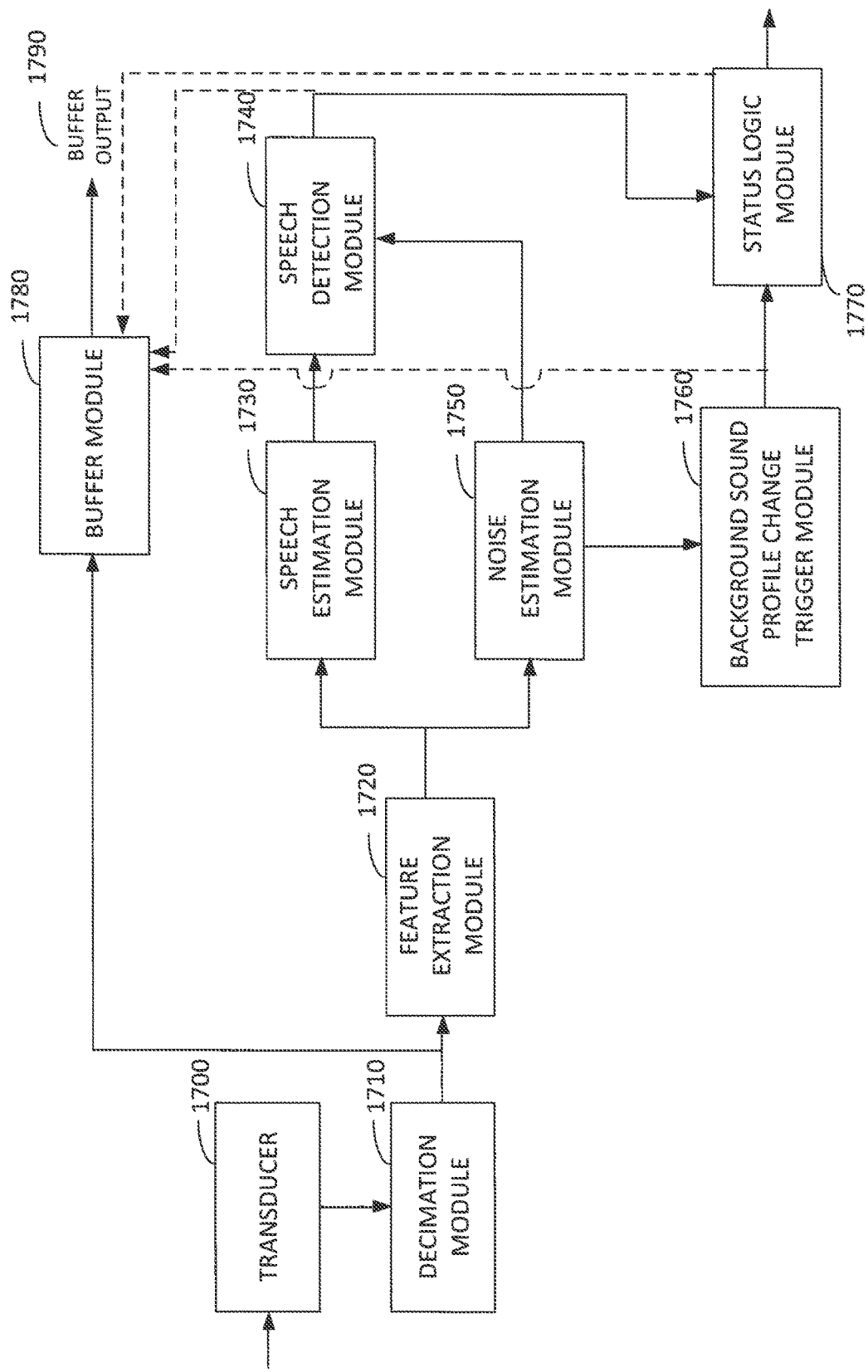
FIG. 17 illustrates another VAD technique with embedded background sound profile change trigger.

Referring to FIG. 17, another implementation may include a decimation module 1710, if desired, that performs decimation of the input sound stream samples from a pulse density modulation (PDM) domain to a pulse code modulation (PCM) domain from a transducer 1700. For example, the pulse density signal may be obtained from a digital microphone or from an analog-to-digital converter receiving an analog signal from an analog microphone. The output of the decimation module 1710 may be provided to a feature extraction module 1720. The feature extraction module 1720 may determine various features, often referred to as vectors, of the speech. A speech presence detector may include a speech estimation module 1730 and a speech detection module 1740. The speech estimation module 1730 preferably analyses data over a relatively short time period to estimate the speech energy. The speech detection module 1740 may detect speech by calculating a signal-to-noise ratio and comparing it to a threshold to determine the presence of speech.

A noise estimation module 1750 may receive an input from the feature extraction module 1720. The noise estimation module 1750 preferably analyses data over a relatively long time period to estimate the background sound. The speech detection module 1740 may receive an output from the noise estimation module 1750 to reduce the effects of noise in detecting speech. A BSPCT module 1760 may receive an input from the noise estimation module 1750, which may determine any suitable type of relevant change in the characteristics of the background noise. The BSPCT, may calculate a delta variation of the estimated background sound profile, e.g., the noise energy, and compare it to a preset threshold to determine whether or not to report a change in the background sound profile. The background sound profile, and a change in the background sound profile, may be defined and computed from the background sound in any suitable manner.

The output of the BSPCT module 1760 and the speech detection module 1740 may be provided to a status logic module 1770. The status logic module 1770 may provide a signal, which may be in the form of an interrupt, that indicates which signal is active or whether one of the signals is active. The status logic module 1770 may be as described with respect to FIG. 14. A buffer module 1780 may receive the output of the decimation module 1710 which is selectively provided to a buffer output 1790, based upon an output of the logic module 1770. For example, when the speech detection module 1740 detects speech and/or the BSPCT module 1760 detects an event, the buffer module 1780 may provide an output stream for subsequent processing. In addition, the buffer module 1780 may be a catch-up buffer that stores the sound data chopped off due to the VAD latency.

Each system described herein may be implemented using a computer-readable medium that may be any available medium that may be accessed by a processor. The computer-readable medium may include both a volatile and a non-volatile medium, a removable and non-removable medium, and a storage medium. The storage medium may include RAM, flash memory, ROM, erasable programmable read-only memory (EPROM), electrically erasable programmable read-only memory (EEPROM), registers, hard disk, a removable disk, a compact disk read-only memory (CD-ROM), or any other form of storage medium. The processor may be operatively coupled via a bus to a display, such as a Liquid Crystal Display (LCD). The display may display information to the user. A keyboard and a cursor control device, such as a touch screen, can also be operatively coupled to bus to enable the user to interface with the system.

The processor may be operatively coupled via the bus to one or more databases. The database may store data in an integrated collection of logically-related records or files. The database may be an operational database, an analytical database, a data warehouse, a distributed database, an end-user database, an external database, a navigational database, an in-memory database, a document-oriented database, a real-time database, a relational database, an object-oriented database, a NoSQL database, or any other database, or any combination thereof.

The memory may store software modules that provide functionality when executed in combination with the processor. The modules can include a data visualization module. The data visualization module may include a data visualization application that can collect, organize, synchronize, and display case data. The data visualization module may comprise a plurality of modules that each provide specific individual functionality for collecting, organizing, synchronizing, entering, modifying, and displaying data. The memory may also store an operating system. The operating system may provide operating system functionality for the system. The memory may also store one or more additional applications to include additional functionality for an overall system.

Figure 18:
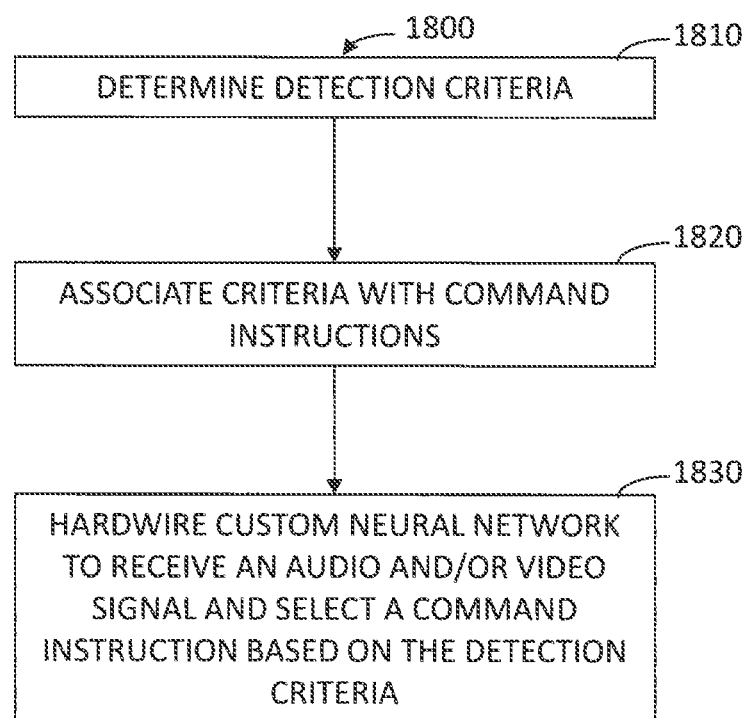
FIG. 18 illustrates a method for hardwiring a custom neural network circuit.

Referring to FIG. 18, a method 1800 for designing, constructing, implementing, or otherwise providing a system for providing commands based on audio and/or video signals can include the following steps. The steps can be executed in various orders as would be appreciated and understood by a person of ordinary skill in the art according to the teachings of the present disclosure.

At step 1810, detection criteria can be determined. The detection criteria can be criteria for detecting specific events in an audio signal and/or a video signal. For instance, the detection criteria can be determined for the purposes of recognizing a keyword, command phrase, voiced sound, unvoiced sound, face in a video, etc. In some embodiments, the detection criteria can include weights usable by a neural network.

At step 1820, command instructions can be associated with the detection criteria. For instance, the command instructions can include instructions for executing a desired response to detecting a keyword, command phrase, voiced sound, unvoiced sound, face in a video, etc.

At step 1830, a custom neural network can be hardwired to receive an audio and/or video signal and select a command instruction based on the detection criteria. For instance, the neural network can be hardwired to receive the audio signal, propagate the signal through paths in the neural network based on the detection criteria, and provide an output that is associated with a command instruction, thereby selecting the command instruction. The detection criteria can include weights, and the custom neural network can be hardwired to include paths that are weighted according to the weights. In some embodiments the audio signal can be an audio stream, and the custom neural network can be hardwired to receive the audio stream.

The custom neural network can include a neural network such as the neural networks 710, 760, 810, 860, 910, 1020, 1120, 1121 illustrated herein, disclosed herein, variations thereof, and alternatives thereof as would be appreciated and understood by a person of ordinary skill in the art according to the teachings of the present disclosure.

Figure 19:
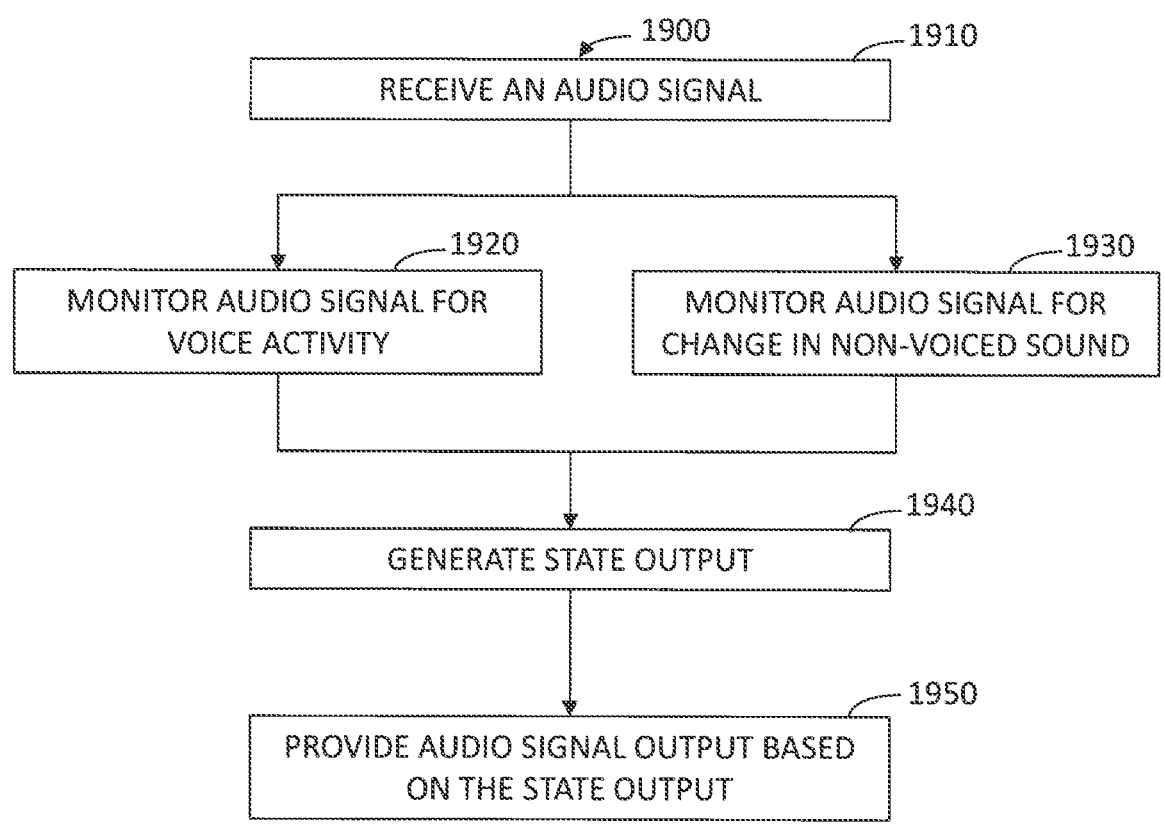
FIG. 19 illustrates a method for monitoring for voice activity and change in sound activity in an audio stream.

Referring to FIG. 19, a method 1900 for monitoring for voice activity and change in sound activity in an audio stream can include the following steps. The steps can be executed in various orders as would be appreciated and understood by a person of ordinary skill in the art according to the teachings of the present disclosure.

At step 1910, an audio signal can be received. The audio signal can be an audio stream, or the audio signal can be a portion of an audio stream.

At step 1920, the audio signal can be monitored for voice activity. The audio signal can be monitored using VAD, event detection, other techniques described herein, variations thereof, and alternatives thereof as would be appreciated and understood by a person of ordinary skill in the art according to the teachings of the present disclosure. In some embodiments, speech energy can be determined for a moving time window that has a relatively short time period, non-voiced sound energy can be determined for a moving time window that has a longer time period than used for determining the speech energy, and voice activity can be detected by comparing the speech energy with the non-voiced sound energy.

At step 1930, the audio signal can be monitored for a change in a non-voiced sound. The audio signal can be monitored with a sound profile change trigger module such as illustrated and described in relation to FIGS. 13 through 17, variations thereof, and alternatives thereof as would be appreciated and understood by a person of ordinary skill in the art according to the teachings of the present disclosure. For instance, the non-voiced sound energy can be determined for the moving time window as described in relation to step 1920 and the moving time window can also be used to determine a change in voiced sound energy over time.

At step 1940, a state output can be generated based on whether or not a change in non-voice sound is detected at step 1930 and whether or not voice activity is detected at step 1920. The state can be generated by a status logic module 1510, 1650, 1770 as illustrated and described herein, variations thereof, and alternatives thereof as would be appreciated and understood by a person of ordinary skill in the art according to the teachings of the present disclosure.

At step 1950, an audio signal can be output based on the state output generated in step 1940. For instance, the state output can provide an indication that voice activity is detected and the audio signal can be a portion of a received audio stream received at step 1910 such that the audio signal is a portion of the audio stream following the detection of voice activity. The audio signal and the state output can then be provided to a system configured to further analyze the audio signal (e.g. a custom neural network circuit). The state output can be used by the system to determine what process to use to perform further analysis. For example, the system can perform one process if the state indicates that a voice is detected and a different process if the state indicates that a change in non-voiced sound is detected.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention. Project type configurations may be created automatically by the system or by the user of the system through an interface. The resulting project types may result in outputs suitable for use in the data models and the workflow models.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

What is claimed is:

1. A system comprising:
 non-transitory computer-readable medium comprising a plurality of command instructions stored thereon; and
 a customized neural network detector comprising a fixed deep learning neural network hardware topology with a set of fixed weights tailored for system-specific functions and programmable weights providing limited adaptability, predetermined structural parameters optimized for low power consumption, fixed activation functions for specific network operations and customizable activation functions, the neural network detector hardwired to receive an audio signal and/or video signal, and hardwired to select, based at least in part on the audio signal and/or video signal, a command instruction of the plurality of command instructions independently within the system without external network data transmission.

2. The system of claim 1, further comprising:
 an electrical input configured to receive the audio signal and/or video signal and directly provide the audio signal and/or video signal to the neural network detector; and
 an application processor interface in communication with the neural network detector configured to transmit the selected command instruction, wherein the electrical input, neural network detector, and application processor interface are integrated in a single device.

3. The system of claim 2, wherein the single device is a single semiconductor chip.

4. The system of claim 2, wherein the single device is one of a standalone chip, a codec chip, a microphone, a speaker, an image capture device, and an application processor.

5. The system of claim 1, wherein the audio signal is an audio stream and/or the video signal is a video stream.

6. The system of claim 1, further comprising:
 an event detection circuit configured to receive an audio stream and/or video stream, detect an event based on the audio stream and/or video stream, and transmit the audio signal and/or video signal following the event to the neural network detector.

7. The system of claim 6, wherein the event detection circuit comprises a voice activity detection (VAD) module, wherein the VAD module is configured to receive the audio stream and detect a presence of a voice in the audio stream, and wherein the neural network detector is hardwired to receive the audio signal and is hardwired to select, based at least in part on the audio signal, the command instruction of the plurality of command instructions.

8. The system of claim 7, wherein the event detection circuit further comprises a sound profile change trigger module configured to detect a change in non-voiced sound in the audio stream.

9. The system of claim 8 wherein the event detection circuit further comprises a status logic module configured to provide an output state based at least in part on an output of the VAD module and an output of the sound profile change trigger module.

10. The system of claim 1, further comprising:
 a microphone interface; and
 a digital signal processing block in communication with the microphone interface and the neural network detector.

11. The system of claim 1, further comprising:
 a microphone interface;
 a digital signal processing block in communication with the microphone interface; and
 a multiplexer in communication with the digital signal processing block and the neural network detector.

12. The system of claim 1, wherein the neural network hardware topology comprises a hardware deep learning data path.

13. The system of claim 1, wherein the fixed deep learning neural network hardware topology includes a long short-term memory (LSTM) network for processing the audio signal, and is configured with a fixed number of layers optimized for audio processing and recognition.

14. The system of claim 1, wherein the fixed deep learning neural network hardware topology includes a convolutional neural network (CNN) for processing the video signal, and is configured with fixed filter sizes and layer configurations for real-time video processing tasks and reduced power consumption.

15. The system of claim 1, wherein the programmable weights are for specific neural network layers to provide adaptability in processing and maintaining power efficiency.

16. A method comprising:

determining a plurality of detection criteria;

associating each of the detection criteria with a respective command instruction of a plurality of command instructions; and hardwiring a customized fixed neural network based on the detection criteria such that the neural network is hardwired to receive an audio signal and/or video signal and select a command instruction based on the received audio signal and/or video signal and based on the detection criteria independently without external network data transmission, the detection criteria including a set of fixed weights tailored for specific functions and programmable weights providing limited adaptability, fixed activation functions for specific network operations and customizable activation functions, with predetermined structural parameters optimized for low power consumption.

17. The method of claim 16, wherein hardwiring the neural network based on the detection criteria comprises hardwiring the neural network to include weighted paths, each weighted path associated with a weight.

18. The method of claim 16, further comprising:

transmitting the selected command instruction to an application processor.

19. The method of claim 16, wherein the neural network comprises a convolutional neural network and/or a recurrent neural network.

20. The method of claim 16, further comprising:

hardwiring the neural network to receive the audio signal such that the audio signal is an audio stream; and hardwiring the neural network to continuously monitor the audio stream to select the command instruction.

21. The method of claim 16, further comprising:

configuring a voice activity detection (VAD) module to receive an audio stream and provide the audio signal to the neural network in response to detecting a voice in the audio stream, the audio signal being a portion of the audio stream.

22. The method of claim 16, further comprising:

configuring a sound profile change trigger module to receive an audio stream and provide the audio signal to the neural network in response to detecting a change in a non-voiced sound in the audio stream, the audio signal being a portion of the audio stream.

* * * * *